US012671398B2

(12) United States Patent
Peng et al.

(10) Patent No.: US 12,671,398 B2
(45) Date of Patent: Jun. 30, 2026

(54) METHOD FOR SIGNAL PROCESSING, CIRCUIT FOR SIGNAL PROCESSING, CHIP FOR SIGNAL PROCESSING, AND ELECTRONIC DEVICE

(71) Applicant: Shenzhen Goodix Technology Co., Ltd., Shenzhen (CN)

(72) Inventors: Jiangyang Peng, Shenzhen (CN); Yuqing Yang, Shenzhen (CN); Bohao Li, Shenzhen (CN)

(73) Assignee: SHENZHEN GOODIX TECHNOLOGY CO., LTD. (CN)

( * ) Notice: Subject to any disclaimer, the term of this patent is extended or adjusted under 35 U.S.C. 154(b) by 25 days.

(21) Appl. No.: 19/006,625

(22) Filed: Dec. 31, 2024

(65) Prior Publication Data

US 2026/0095155 A1    Apr. 2, 2026

(30) Foreign Application Priority Data

Sep. 30, 2024    (CN) ......................... 202411398253.9

(51) Int. Cl.
*H03K 3/017* (2006.01)

(52) U.S. Cl.
CPC ....... *H03K 3/017* (2013.01); *H03F 2200/351* (2013.01)

(58) Field of Classification Search
CPC ............ H03K 7/00; H03K 7/08; H03K 3/023; H03K 3/017; H03K 3/01; H03K 5/153; H03K 5/1532; H03K 5/1534; H03K 5/1536; H03K 5/19; H03K 5/22; H03F 3/217; H03F 3/2171; H03F 3/2175; H03F 3/2178; H03F 3/24; H03F 3/245; H03F 3/26; H03F 3/265; H03F 3/34; H03F 3/343; H03F 3/345; H03F 3/45; H03F 3/45071;

(Continued)

(56) References Cited

U.S. PATENT DOCUMENTS

2007/0109165 A1* 5/2007 Midya ................... H03M 3/366
                                                         341/144
2021/0377404 A1 12/2021 Nagata
2024/0322798 A1 9/2024 Chang et al.

FOREIGN PATENT DOCUMENTS

CN        101217262 A    7/2008
CN        101667820 A    3/2010

(Continued)

*Primary Examiner* — Jung Kim
(74) *Attorney, Agent, or Firm* — Emerson, Thomson & Bennett, LLC; Roger D. Emerson; Peter R. Detorre

(57) ABSTRACT

Embodiments of the present disclosure provide a method for signal processing, a circuit for signal processing, a chip for signal processing, and an electronic device. The method for signal processing includes: outputting a positive output signal and a negative output signal based on the PWM positive signal and the PWM negative signal; wherein, in response to an absolute value of an amplitude of the input signal being larger than 0 and smaller than a first threshold, each of the positive output signal and the negative output signal includes 2 pulses within one pulse period, and pulse widths of the pulses included in the positive output signal are different from pulse widths of the pulses included in the negative output signal. This solution can reduce the frequency requirements for a passive filter that processes positive and negative output signals, thereby reducing the costs of the system for signal processing.

20 Claims, 14 Drawing Sheets

(58) Field of Classification Search
CPC .. H03F 3/45076; H03F 3/45179; H03F 3/181;
H03F 2200/03; H03F 2200/339; H03F
2200/351
See application file for complete search history.

(56)  References Cited

FOREIGN PATENT DOCUMENTS

CN          101977019  A     2/2011
CN          118074683  A     5/2024

* cited by examiner

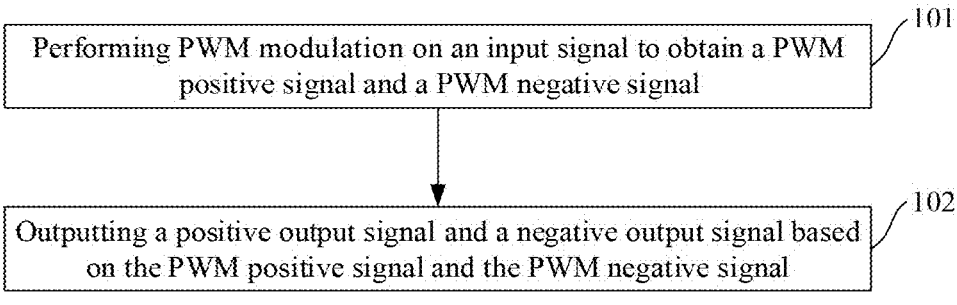

101
Performing PWM modulation on an input signal to obtain a PWM positive signal and a PWM negative signal 102
Outputting a positive output signal and a negative output signal based on the PWM positive signal and the PWM negative signal

FIG. 1

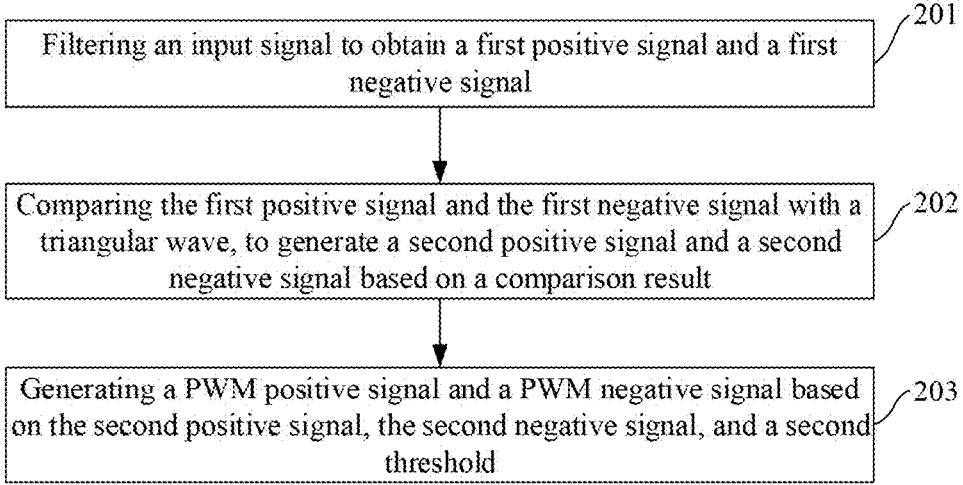

201
Filtering an input signal to obtain a first positive signal and a first negative signal 202
Comparing the first positive signal and the first negative signal with a triangular wave, to generate a second positive signal and a second negative signal based on a comparison result 203
Generating a PWM positive signal and a PWM negative signal based on the second positive signal, the second negative signal, and a second threshold

FIG. 2

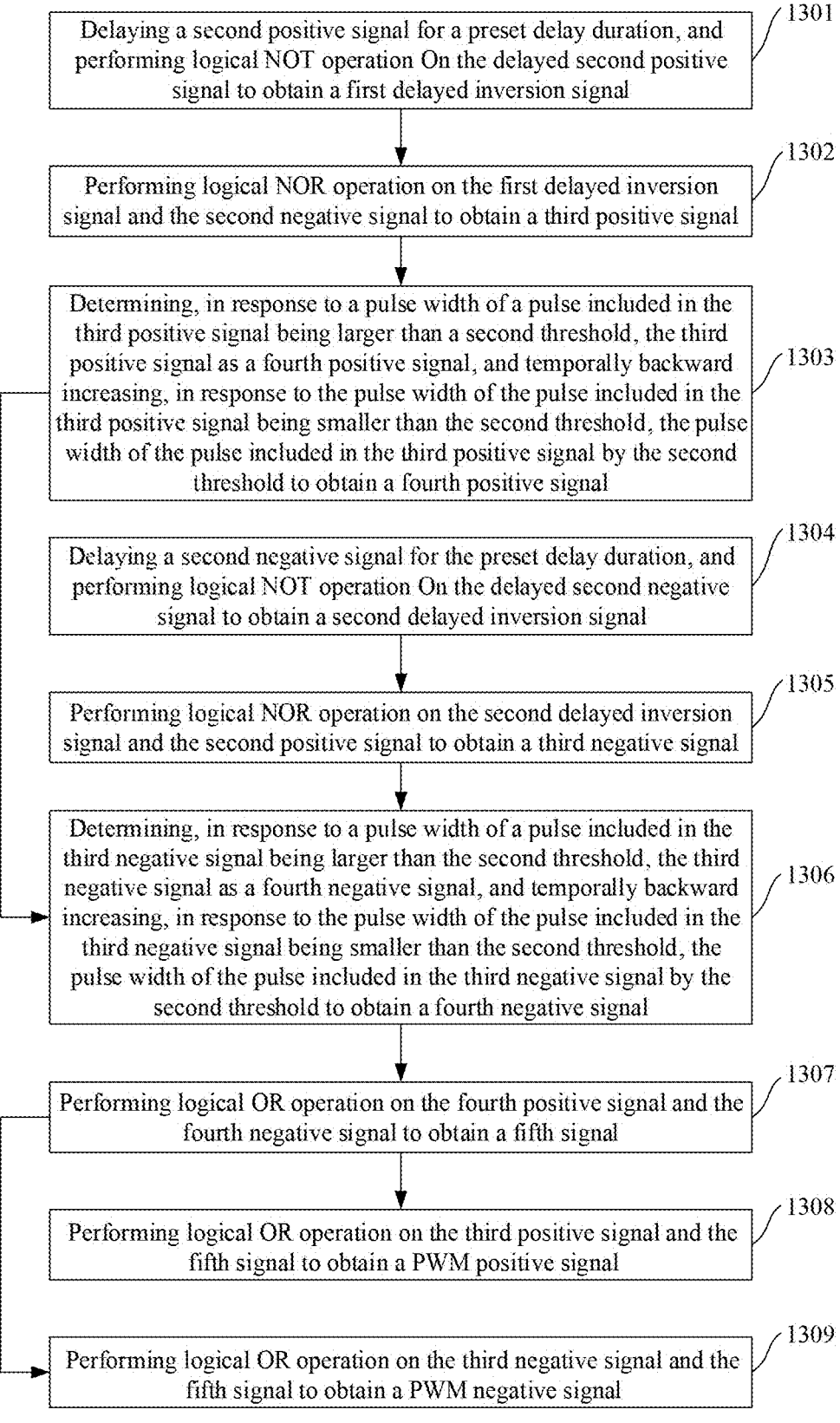

Delaying a second positive signal for a preset delay duration, and performing logical NOT operation On the delayed second positive signal to obtain a first delayed inversion signal — 1301

Performing logical NOR operation on the first delayed inversion signal and the second negative signal to obtain a third positive signal — 1302

Determining, in response to a pulse width of a pulse included in the third positive signal being larger than a second threshold, the third positive signal as a fourth positive signal, and temporally backward increasing, in response to the pulse width of the pulse included in the third positive signal being smaller than the second threshold, the pulse width of the pulse included in the third positive signal by the second threshold to obtain a fourth positive signal — 1303

Delaying a second negative signal for the preset delay duration, and performing logical NOT operation On the delayed second negative signal to obtain a second delayed inversion signal — 1304

Performing logical NOR operation on the second delayed inversion signal and the second positive signal to obtain a third negative signal — 1305

Determining, in response to a pulse width of a pulse included in the third negative signal being larger than the second threshold, the third negative signal as a fourth negative signal, and temporally backward increasing, in response to the pulse width of the pulse included in the third negative signal being smaller than the second threshold, the pulse width of the pulse included in the third negative signal by the second threshold to obtain a fourth negative signal — 1306

Performing logical OR operation on the fourth positive signal and the fourth negative signal to obtain a fifth signal — 1307

Performing logical OR operation on the third positive signal and the fifth signal to obtain a PWM positive signal — 1308

Performing logical OR operation on the third negative signal and the fifth signal to obtain a PWM negative signal — 1309

FIG. 13

METHOD FOR SIGNAL PROCESSING, CIRCUIT FOR SIGNAL PROCESSING, CHIP FOR SIGNAL PROCESSING, AND ELECTRONIC DEVICE

CROSS REFERENCE TO RELATED APPLICATIONS

This application claims priority to the Chinese Patent Application No. 202411398253.9, filed on Sep. 30, 2024, and entitled "METHOD FOR SIGNAL PROCESSING, CIRCUIT FOR SIGNAL PROCESSING, CHIP FOR SIGNAL PROCESSING, AND ELECTRONIC DEVICE", the disclosures of which is hereby incorporated by reference in its entirety.

TECHNICAL FIELD

Embodiments of the present disclosure relate to the technical field of electronics, and particularly relate to a method for signal processing, a circuit for signal processing, a chip for signal processing, and an electronic device.

BACKGROUND

Pulse-Width Modulation (PWM) is a technology that uses a digital output from a microprocessor to control an analog circuit, so that a pulse width is modulated to equivalently obtain a required waveform (including shape and amplitude), that is, adjusting voltage and frequency by changing duty cycle.

At present, an audio signal is amplified by a Class D power amplifier (also referred to as a digital power amplifier or a switching power amplifier) using PWM technology. The Class D power amplifier extracts an output differential mode component of a comparison unit, and then transmits it to a power output module. An output signal from the power output module drives an audio device after passing through a passive filter.

A signal frequency supported by the passive filter is negatively correlated to costs. That is, costs of a passive filter that supports low frequency signals are higher than costs of a passive filter that supports high frequency signals. However, an output signal from a power output module in an existing Class D power amplifier is at a low frequency, thereby requiring the use of a passive filter that supports low frequency signals, and resulting in high costs of the system for signal processing.

SUMMARY

In view of this, embodiments of the present disclosure provide a method for signal processing, a circuit for signal processing, a chip for signal processing, and an electronic device, to at least partially solve the above problems.

According to an embodiment in a first aspect of the present disclosure, a method for signal processing is provided, including: performing PWM modulation on an input signal to obtain a PWM positive signal and a PWM negative signal; and outputting a positive output signal and a negative output signal based on the PWM positive signal and the PWM negative signal; wherein, in response to an absolute value of an amplitude of the input signal being larger than 0 and smaller than a first threshold, each of the positive output signal and the negative output signal includes 2 pulses within one pulse period, and pulse widths of the pulses included in the positive output signal are different from pulse widths of the pulses included in the negative output signal.

According to an embodiment in a second aspect of the present disclosure, a circuit for signal processing is provided, including: a modulation module configured to perform PWM modulation on an input signal to obtain a PWM positive signal and a PWM negative signal; and a power output module configured to output a positive output signal and a negative output signal based on the PWM positive signal and the PWM negative signal; wherein, in response to an absolute value of an amplitude of the input signal being larger than 0 and smaller than a first threshold, each of the positive output signal and the negative output signal includes 2 pulses within one pulse period, and pulse widths of the pulses included in the positive output signal are different from pulse widths of the pulses included in the negative output signal.

According to an embodiment in a third aspect of the present disclosure, a chip for signal processing is provided, wherein the chip for signal processing is configured to implement the method according to the above first aspect.

According to an embodiment in a fourth aspect of the present disclosure, an electronic device is provided, including: a signal source, a signal receiving terminal, and an apparatus for signal processing, wherein the apparatus for signal processing includes the circuit for signal processing according to the above second aspect or the chip for signal processing according to the above third aspect; the apparatus for signal processing is connected between the signal source and the signal receiving terminal; the signal source is configured to transmit an input signal to the apparatus for signal processing; and the signal receiving terminal is configured to receive a positive output signal and a negative output signal outputted from the apparatus for signal processing.

According to solutions of embodiments of the present disclosure, PWM is performed on an input signal to obtain a PWM positive signal and a PWM negative signal, and a positive output signal and a negative output signal are outputted based on the PWM positive signal and the PWM negative signal, wherein, when an absolute value of an amplitude of the input signal is larger than 0 and smaller than a first threshold, each of the positive output signal and the negative output signal includes 2 pulses within one pulse period, and pulse widths of the pulses included in the positive output signal are different from pulse widths of the pulses included in the negative output signal. When the absolute value of the amplitude of the input signal is larger than 0 and smaller than the first threshold, that is, the absolute value of the amplitude of the input signal is small, each of the positive output signal and the negative output signal outputted from a power output module includes 2 pulses, so that the positive output signal and the negative output signal are at high frequencies, so that the positive output signal and the negative output signal can be processed using a passive filter that supports high signal frequencies, and the passive filter that supports high signal frequencies is less expensive, thus reducing the costs of the system for signal processing.

BRIEF DESCRIPTION OF DRAWINGS

To more clearly describe technical solutions in embodiments of the present disclosure or the prior art, drawings to be used in the description of the embodiments or the prior art will be briefly introduced below. Apparently, the drawings in the description below are merely some embodiments disclosed in the embodiments of the present disclosure. For those of ordinary skills in the art, other drawings may also be obtained based on these drawings.

FIG. 1 is a flowchart of a method for signal processing in an embodiment of the present disclosure;

FIG. 2 is a flowchart of a PWM method in an embodiment of the present disclosure;

FIG. 13 is a flowchart of a method for generating a PWM positive signal and a PWM negative signal in an embodiment of the present disclosure;

DETAILED DESCRIPTION

Figure 3:
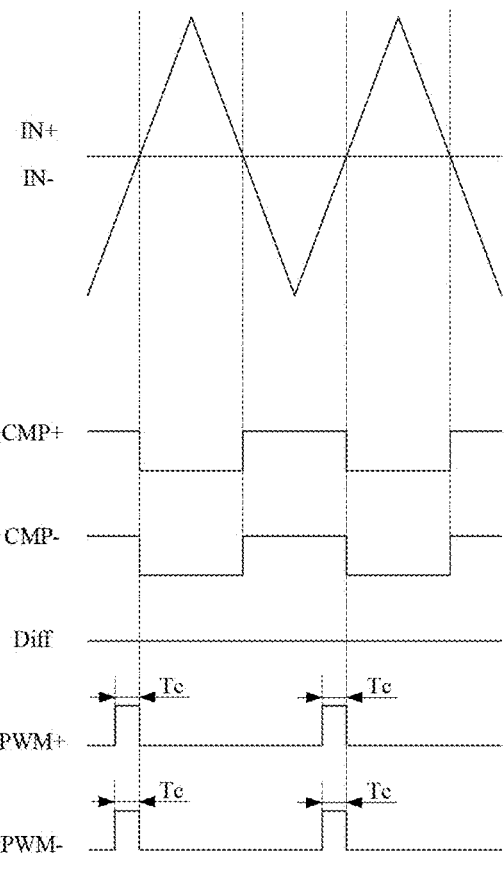
FIG. 3 is a schematic diagram of a PWM positive signal and a PWM negative signal when an amplitude of an input signal is equal to 0 in an embodiment of the present disclosure.

To enable those skilled in the art to better understand technical solutions of embodiments of the present disclosure, the technical solutions of the embodiments of the present disclosure will be clearly and completely described below with reference to the drawings in the embodiments of the present disclosure. Apparently, the described embodiments are merely some, instead of all, of the embodiments of the present disclosure. All other embodiments obtained by those of ordinary skills in the art based on some embodiments among the embodiments of the present disclosure should be encompassed within the scope of protection of the embodiments of the present disclosure.

The terms used in the present disclosure are intended merely to describe particular embodiments, and are not intended to limit the present disclosure. The singular forms of "a" and "the" used in the present disclosure and the appended claims are also intended to include plural forms, unless the context clearly indicates other meanings. It should be further understood that the term "and/or" used herein refers to and includes any or all possible combinations of one or more associated listed items.

It should be understood that various kinds of information may be described by using the terms, such as first, second, and third, in the present disclosure, but the information should not be limited to these terms. These terms are merely used to distinguish between information of a same type. For example, the first piece of information may also be called the second piece of information, and similarly, the second piece of information may also be called the first piece of information, without departing from the scope of the present disclosure. Depending on the context, as used herein, the word "if" may be interpreted as "at the time of . . . " or "when . . . " or "in response to determining."

In order to make objectives, technical solutions, and advantages of the present disclosure clearer, embodiments of the present disclosure will be further described in detail below with reference to the drawings.

Method for Signal Processing

FIG. 1 is a flowchart of a method for signal processing in an embodiment of the present disclosure. As shown in FIG. 1, the method for signal processing includes the following steps:

Step 101: performing PWM modulation on an input signal to obtain a PWM positive signal and a PWM negative signal.

The input signal may include a positive input signal and a negative input signal, and the input signal may be an analog signal. The performing PWM modulation on the input signal may include a plurality of steps. For example, a differential mode signal of the positive input signal and the negative input signal included in the input signal is first coupled to an input terminal of a loop filter unit, filtered, and then transported to a comparison unit for comparison with a triangular wave. Then, logical operation is performed on the comparison result to obtain the PWM positive signal and the PWM negative signal.

The input signal may be a signal with PWM requirements, such as an audio signal.

Step 102: outputting a positive output signal and a negative output signal based on the PWM positive signal and the PWM negative signal.

After the PWM positive signal and the PWM negative signal are obtained, the PWM positive signal and the PWM negative signal may be processed by, e.g., amplification and inverse operation, to obtain the positive output signal and the negative output signal, and then output the positive output signal and negative output signal. In an example, when the input signal is the audio signal, the outputted positive output signal and negative output signal can be used to drive a speaker after being filtered through a passive filter (such as an LC filter).

Pulse widths of the PWM positive signal and the PWM negative signal are associated with an absolute value of an amplitude of the input signal, and the positive output signal and the negative output signal are obtained based on the PWM positive signal and the PWM negative signal, so that the positive output signal and the negative output signal are associated with the absolute value of the amplitude of the input signal. Specifically, in response to the absolute value of the amplitude of the input signal being larger than 0 and smaller than a first threshold, each of the positive output signal and the negative output signal includes 2 pulses within one pulse period, and pulse widths of the pulses included in the positive output signal are different from pulse widths of the pulses included in the negative output signal.

In an embodiment of the present disclosure, PWM is performed on the input signal to obtain the PWM positive signal and the PWM negative signal, and the positive output signal and the negative output signal are outputted based on the PWM positive signal and the PWM negative signal, wherein, when the absolute value of the amplitude of the input signal is larger than 0 and smaller than the first threshold, each of the positive output signal and the negative output signal includes 2 pulses within one pulse period, and the pulse widths of the pulses included in the positive output signal are different from the pulse widths of the pulses included in the negative output signal. When the absolute value of the amplitude of the input signal is larger than 0 and smaller than the first threshold, that is, the absolute value of the amplitude of the input signal is small, each of the positive output signal and the negative output signal outputted from a power output module includes 2 pulses, so that the positive output signal and the negative output signal are at high frequencies, so that the positive output signal and the negative output signal can be processed using a passive filter that supports high signal frequencies, and the passive filter that supports high signal frequencies is less expensive, thus reducing the costs of the system for signal processing.

In a possible implementation, in response to any one input signal with an absolute value of an amplitude falling within a range of (0, first threshold), a pulse width of a pulse included in one output signal of the positive output signal and the negative output signal is equal to a preset second threshold, and a pulse width of a pulse included in the other output signal of the positive output signal and the negative output signal is larger than the second threshold. That is, for any first input signal and second input signal with an absolute value of an amplitude larger than 0 and smaller than the first threshold, in response to a pulse width of a pulse included in one output signal of the positive output signal and the negative output signal of the first input signal being equal to the second threshold, a pulse width of a pulse included in the other output signal thereof is larger than the second threshold, and in response to a pulse width of a pulse included in one output signal of the positive output signal and the negative output signal of the second input signal being equal to the second threshold, a pulse width of a pulse included in the other output signal thereof is larger than the second threshold.

When the absolute value of the amplitude of the input signal is larger than 0 and smaller than the first threshold, if the positive output signal includes 2 pulses with pulse widths equal to the second threshold within one pulse period, the negative output signal includes 2 pulses with pulse widths larger than the second threshold within one pulse period, while if the negative output signal includes 2 pulses with pulse widths equal to the second threshold within one pulse period, the positive output signal includes 2 pulses with pulse widths larger than the second threshold within one pulse period. It should be noted that the "including 2 pulses within one pulse period" means that there are, and there are only, 2 pulses within one pulse period.

The amplitude of the input signal refers to an amplitude of the differential mode signal of the positive input signal and the negative input signal. The amplitude of the input signal may be positive, negative, or 0. The signal strength of the input signal is positively correlated to the absolute value of the amplitude thereof. It should be noted that, for ease of description, the amplitude of the input signal described below refers to the amplitude of the input signal. The first threshold is larger than 0 and smaller than a maximum value of the absolute value of the amplitude of the input signal.

The positive output signal and the negative output signal may be generated by the power output module based on the PWM positive signal and the PWM negative signal. A pulse width of the differential mode signal of the positive output signal and the negative output signal matches a pulse width of a differential mode signal of the PWM positive signal and the PWM negative signal. The second threshold is larger than a minimum pulse width to which the power output module can respond. The absolute value of the amplitude of the input signal is defined as a critical amplitude when the pulse width of the differential mode signal of the positive output signal and the negative output signal is equal to the minimum pulse width. The first threshold is larger than or equal to the critical amplitude.

In an example, when the absolute value of the amplitude of the input signal is smaller than the first threshold, periods (frequencies) of the positive output signal and the negative output signal are same as periods (frequencies) of the PWM positive signal and the PWM negative signal, and periods (frequencies) of the PWM positive signal and the PWM negative signal are same as a period (frequency) of the triangular wave. When the absolute value of the amplitude of the input signal is larger than the first threshold, the frequency of the positive output signal or the negative output signal is equal to 0, that is, one of the positive output signal and the negative output signal does not include a pulse.

In an embodiment of the present disclosure, PWM is performed on the input signal to obtain the PWM positive signal and the PWM negative signal, and the positive output signal and the negative output signal are outputted based on the PWM positive signal and the PWM negative signal. When the absolute value of the amplitude of the input signal is larger than 0 and smaller than the first threshold, each of the positive output signal and the negative output signal includes 2 pulses within one pulse period, a pulse width of a pulse included in one output signal of the positive output signal and the negative output signal is equal to the second threshold, and a pulse width of a pulse included in the other output signal of the positive output signal and the negative output signal is larger than the second threshold, that is, for any one input signal with an absolute value of an amplitude larger than 0 and smaller than the first threshold, there is always one corresponding output signal of the positive output signal and the negative output signal that includes a pulse with a pulse width equal to the second threshold, and the other output signal thereof includes a pulse with a pulse width larger than the second threshold, to ensure that the differential mode signal of the positive output signal and the negative output signal includes a pulse, so that the differential mode signal of the positive output signal and the negative output signal matches the amplitude of the input signal, to ensure the stability and accuracy of processing of the input signal.

Since the pulse width of the differential mode signal of the PWM positive signal and the PWM negative signal is positively correlated to the absolute value of the amplitude of the input signal, the pulse width of the differential mode signal of the PWM positive signal and the PWM negative signal is small when the amplitude of the input signal is small. When the absolute value of the amplitude of the input signal is larger than 0 and smaller than the first threshold, that is, when the absolute value of the amplitude of the input signal is small, the power output module can still respond to the differential mode signal of the PWM positive signal and the PWM negative signal, and output the positive output signal and the negative output signal each of which includes 2 pulses respectively, thereby feeding back the positive output signal and the negative output signal to the loop filter unit, ensuring the suppression effects of the loop on noise and system nonlinearity, and ensuring the quality of the processed signals.

In a possible implementation, when the absolute value of the amplitude of the input signal is larger than 0 and smaller than the first threshold, a falling edge of each pulse included in the positive output signal is temporally aligned to a falling edge of 1 corresponding pulse included in the negative output signal, wherein there is one-to-one correspondence between the pulses included in the positive output signal and the pulses included in the negative output signal.

When the absolute value of the amplitude of the input signal is larger than 0 and smaller than the first threshold, the positive output signal includes a temporally prior first pulse and a temporally later second pulse within one pulse period, and the negative output signal includes a temporally prior third pulse and a temporally later fourth pulse within one pulse period, wherein falling edges of the first pulse and the third pulse are temporally aligned, and falling edges of the second pulse and the fourth pulse are temporally aligned. If a pulse width of each of the first pulse and the second pulse is larger than the second threshold, a pulse width of each of the third pulse and the fourth pulse is equal to the second threshold, and if a pulse width of each of the first pulse and the second pulse is equal to the second threshold, a pulse width of each of the third pulse and the fourth pulse is larger than the second threshold.

A falling edge of each pulse included in the positive output signal is temporally aligned to a falling edge of 1 corresponding pulse in the negative output signal, there is one-to-one correspondence between the pulses included in the positive output signal and the pulses included in the negative output signal, and therefore, pulse widths of 2 pulse signals included in a common mode signal of the positive output signal and the negative output signal are each equal to the second threshold. For example, when the pulse width of each of the first pulse and the second pulse in the above example is equal to the second threshold, the positive output signal is the common mode signal of the positive output signal and the negative output signal, and when the pulse width of each of the third pulse and the fourth pulse in the above example is equal to the second threshold, the negative output signal is the common mode signal of the positive output signal and the negative output signal.

In an embodiment of the present disclosure, when the absolute value of the amplitude of the input signal is larger than 0 and smaller than the first threshold, the pulse width of the pulse included in the differential mode signal of the PWM positive signal and the PWM negative signal is small. In order to enable the power output module to respond to the PWM positive signal and the PWM negative signal, the PWM positive signal and the PWM negative signal are additionally provided with 2 common mode signals with pulse widths being the second threshold in each pulse period. When the positive output signal and the negative output signal are generated based on the PWM positive signal and the PWM negative signal, the positive output signal and the negative output signal will also include the common mode signal, so that when the absolute value of the amplitude of the input signal is small, the power output module can still respond to the PWM positive signal and the PWM negative signal, thereby ensuring the suppression effects of the loop on noise and system nonlinearity.

In a possible implementation, when the amplitude of the input signal is equal to 0, each of the positive output signal and the negative output signal includes 1 pulse within one pulse period, the pulse widths of the pulses included in the positive output signal and the negative output signal are each equal to the second threshold, and the pulse width of the differential mode signal of the positive output signal and the negative output signal is equal to 0, that is, the differential mode signal of the positive output signal and the negative output signal does not include any pulse.

The positive output signal and the negative output signal match the input signal. When the absolute value of the amplitude of the input signal changes, the differential mode signal of the positive output signal and the negative output signal needs to change accordingly, so as to ensure the correctness of signal processing. When the amplitude of the input signal is equal to 0, each of the positive output signal and the negative output signal includes 1 pulse within one pulse period, and the pulse width of the differential mode signal of the positive output signal and the negative output signal is equal to 0, thereby ensuring that the differential mode signal of the positive output signal and the negative output signal matches the input signal, and ensuring the reliability and accuracy of signal processing.

When the amplitude of the input signal is equal to 0, the pulse widths of the pulses included in the positive output signal and the negative output signal are each equal to the second threshold. The second threshold may be a minimum pulse width of the PWM positive signal and the PWM negative signal to which the power output module can respond, thereby ensuring that the power output module can output a pulse to ensure the suppression effects of the loop on noise and system nonlinearity, and ensuring low power consumption in a standby state.

In an embodiment of the present disclosure, since the number and pulse widths of pulses included in the common mode signal of the positive output signal and the negative output signal are negatively correlated to the efficiency of signal processing, the efficiency of signal processing may indicate power consumption. When the amplitude of the input signal is equal to 0, each of the positive output signal and the negative output signal includes 1 pulse within each pulse period, so that the common mode signal of the positive output signal and the negative output signal includes a small number of pulses, thereby ensuring low power consumption in the standby state. When the amplitude of the input signal is equal to 0, each of the positive output signal and the negative output signal includes 1 pulse, thereby ensuring normal running of a feedback loop during signal processing, and ensuring the performance of signal processing. The feedback loop is composed of a loop filter unit, a comparison unit, a logical operation unit, and a power output module.

The differential mode signal of the positive input signal and the negative input signal is coupled to the input terminal of the loop filter unit, filtered, and then transmitted to the comparison unit for comparison with the triangular wave. Then, logical operation is performed on the comparison result to obtain the PWM positive signal and the PWM negative signal. The power output module generates the positive output signal and the negative output signal based on the PWM positive signal and the PWM negative signal. The power output module feeds back the positive output signal and the negative output signal to the loop filter unit, and the loop filter unit filters the positive input signal and the negative input signal based on the feedback positive output signal and negative output signal.

In a possible implementation, when the absolute value of the amplitude of the input signal is larger than the first threshold, one output signal of the positive output signal and the negative output signal does not include a pulse, and the other output signal of the positive output signal and the negative output signal includes 2 pulses with pulse widths larger than the second threshold within one pulse period.

When the absolute value of the amplitude of the input signal is larger than the first threshold, if the positive output signal does not include a pulse, the negative output signal includes 2 pulses within one pulse period, while if the negative output signal does not include a pulse, the positive output signal includes 2 pulses within one pulse period. It should be noted that the "including 2 pulses within one pulse period" means that there are, and there are only, 2 pulses within one pulse period.

In an embodiment of the present disclosure, PWM is performed on the input signal to obtain the PWM positive signal and the PWM negative signal, and the positive output signal and the negative output signal are outputted based on the PWM positive signal and the PWM negative signal, wherein, when the absolute value of the amplitude of the input signal is larger than the first threshold, one of the positive output signal and the negative output signal does not include a pulse, and the other one thereof includes 2 pulses within one pulse period, that is, the positive output signal and the negative output signal does not have a common mode component, and a differential signal of the positive output signal and the negative output signal is concentrated on a single side, so that a differential mode pulse width of the positive output signal and the negative output signal does not have losses. Since the pulses included in the positive output signal and the negative output signal are generated based on switching of a switching tube in a circuit, only one of the positive output signal and the negative output signal includes a pulse, thereby reducing the switching frequency of the switching tube in the process of generating the positive output signal and the negative output signal, and improving the output efficiency. In the PWM process, the number of occurrences of pulses per unit time is positively correlated to the suppression effects on the loop nonlinearity and noise. When the absolute value of the amplitude of the input signal is larger than the first threshold, one of the positive output signal and the negative output signal includes 2 pulses within one pulse period, thereby improving the suppression effects on the loop nonlinearity and noise when the absolute value of the amplitude of the input signal is large, and improving the performance of the output signal.

In a possible implementation, the pulse width of the differential mode signal of the positive output signal and the negative output signal is positively correlated to the absolute value of the amplitude of the input signal.

In an embodiment of the present disclosure, when the amplitude of the input signal is equal to 0, the pulse width of the differential mode signal of the positive output signal and the negative output signal is equal to 0. When the absolute value of the amplitude of the input signal is larger than 0, the pulse width of the differential mode signal of the positive output signal and the negative output signal is larger than 0, and the pulse width of the differential mode signal of the positive output signal and the negative output signal is positively correlated to the absolute value of the amplitude of the input signal, thereby ensuring that after the input signal is processed, the change of the input signal can be correctly reflected in the differential mode signal of the positive output signal and the negative output signal, and ensuring the accuracy and reliability of signal processing.

In a possible implementation, the input signal may be processed based on the preset second threshold. Based on different absolute values of the amplitude of the input signal, the pulse widths of the pulses included in the positive output signal and the negative output signal satisfy the following relationship with the second threshold:

(1) when the amplitude of the input signal is equal to 0, the pulse widths of the pulses included in the positive output signal and the negative output signal are each equal to the second threshold;

(2) when the absolute value of the amplitude of the input signal is larger than 0 and smaller than the first threshold, a pulse width of a pulse included in one output signal of the positive output signal and the negative output signal is larger than the second threshold, and a pulse width of a pulse included in the other output signal of the positive output signal and the negative output signal is equal to the second threshold; and (3) when the absolute value of the amplitude of the input signal is larger than the first threshold, the pulse widths of the 2 pulses included in the positive output signal or the negative output signal are each larger than the second threshold.

When the amplitude of the input signal is equal to 0, each of the positive output signal and the negative output signal includes 1 pulse with a pulse width equal to the second threshold, and the pulse width of the differential mode signal of the positive output signal and the negative output signal is equal to 0, that is, rising edges and falling edges of the pulses included in the positive output signal and the negative output signal are all temporally aligned, so that the differential mode signal of the positive output signal and the negative output signal matches the input signal, thereby ensuring the accuracy of signal processing.

When the absolute value of the amplitude of the input signal is larger than 0 and smaller than the first threshold, each of the positive output signal and the negative output signal includes 2 pulses. When the pulse widths of the 2 pulses included in the positive output signal are larger than the second threshold, pulse widths of the 2 pulses included in the negative output signal are equal to the second threshold. When the pulse widths of the 2 pulses included in the negative output signal are larger than the second threshold, the pulse widths of the 2 pulses included in the positive output signal are equal to the second threshold. When the absolute value of the amplitude of the input signal is larger than 0 and smaller than the first threshold, a falling edge of each pulse included in the positive output signal is temporally aligned to a falling edge of one pulse included in the negative output signal, so that the pulse width of the differential mode signal of the positive output signal and the negative output signal is not equal to 0, and as the absolute value of the amplitude of the input signal increases (decreases), the pulse width of the differential mode signal of the positive output signal and the negative output signal increases (decreases) accordingly, so that the differential mode signal of the positive output signal and the negative output signal matches the input signal to ensure the accuracy of signal processing.

When the absolute value of the amplitude of the input signal is larger than the first threshold, one output signal of the positive output signal and the negative output signal includes 2 pulses, the other output signal of the positive output signal and the negative output signal does not include a pulse, and pulse widths of the 2 pulses in the output signal including the 2 pulses are each larger than the second threshold. When the absolute value of the amplitude of the input signal is larger than the first threshold, if the positive output signal includes 2 pulses, pulse widths of the 2 pulses included in the positive output signal are each larger than the second threshold, and if the negative output signal includes 2 pulses, pulse widths of the 2 pulses included in the negative output signal are each larger than the second threshold. When the absolute value of the amplitude of the input signal is larger than the first threshold, as the absolute value of the amplitude of the input signal increases (decreases), a sum of the pulse widths of the 2 pulses included in the positive output signal or the negative output signal increases (decreases) accordingly, so that the differential mode signal of the positive output signal and the negative output signal matches the input signal to ensure the accuracy of signal processing.

In an embodiment of the present disclosure, the pulse widths of the pulses included in the positive output signal and the negative output signal are associated with the preset second threshold, the performance of the output signal is associated with the pulse widths of the pulses included in the positive output signal and the negative output signal, and an appropriate second threshold may be set based on requirements for the performance of the output signal. For example, the second threshold may be $\frac{1}{40}$-$\frac{1}{10}$ of a triangular wave period, and on the premise of satisfying the requirements for the performance of the output signal, a small delay duration is set, so that when the amplitude of the input signal is equal to 0, the pulse widths of the pulses included in the positive output signal and the negative output signal are small, thereby reducing the standby power consumption.

In a possible implementation, when PWM is performed on the input signal, a square wave signal may be first generated based on the input signal, and then the PWM positive signal and the PWM negative signal may be generated based on the generated square wave signal and the second threshold. Based on a flow chart of the PWM method as shown in FIG. 2, PWM may be performed on the input signal in accordance with a method including the following steps:

Step 201: filtering the input signal to obtain a first positive signal and a first negative signal.

The input signal includes a positive input signal and a negative input signal. The positive input signal and the negative input signal are filtered, to obtain the first positive signal and the first negative signal. For example, the differential mode signal of the positive input signal and the negative input signal are coupled to the input terminal of the loop filter unit, to filter the positive input signal and negative input signal through the loop filter unit, thus obtaining the first positive input signal and the first negative signal.

In an example, the loop filter unit does not perform inverse operation at its output terminal, a waveform of the first positive signal matches a waveform of the positive input signal, and a waveform of the first negative signal matches a waveform of the negative input signal.

In another example, the loop filter unit performs inverse operation at its output terminal, a waveform of the first positive signal matches a waveform of the negative input signal, and a waveform of the first negative signal matches a waveform of the positive input signal. The output terminal of the loop filter unit outputs the first positive signal and the first negative signal.

Step 202: comparing the first positive signal and the first negative signal with a triangular wave, and generating a second positive signal and a second negative signal based on a comparison result.

After the first positive signal and the first negative signal are acquired, the first positive signal and the first negative signal may be inputted into the comparison unit, so that the comparison unit compares the first positive signal and the first negative signal respectively with the triangular wave, to generate the second positive signal based on a comparison result between the first positive signal and the triangular wave, and generate the second negative signal based on a comparison result between the first negative signal and the triangular wave.

When comparing the first positive signal and the first negative signal with the triangular wave, the comparison unit determines the second positive signal/the second negative signal based on a magnitude relationship between the first positive signal/the first negative signal and the triangular wave.

In an example, based on a schematic diagram of the second positive signal and the second negative signal as shown in FIG. 3, a signal segment in which a first positive signal IN+ (first negative signal IN−) is larger than the triangular wave corresponds to a high level of a second positive signal CMP+ (second negative signal CMP−), and a signal segment in which the first positive signal IN+ (the first negative signal IN−) is smaller than the triangular wave corresponds to a low level of the second positive signal CMP+ (the second negative signal CMP−).

Figure 4:
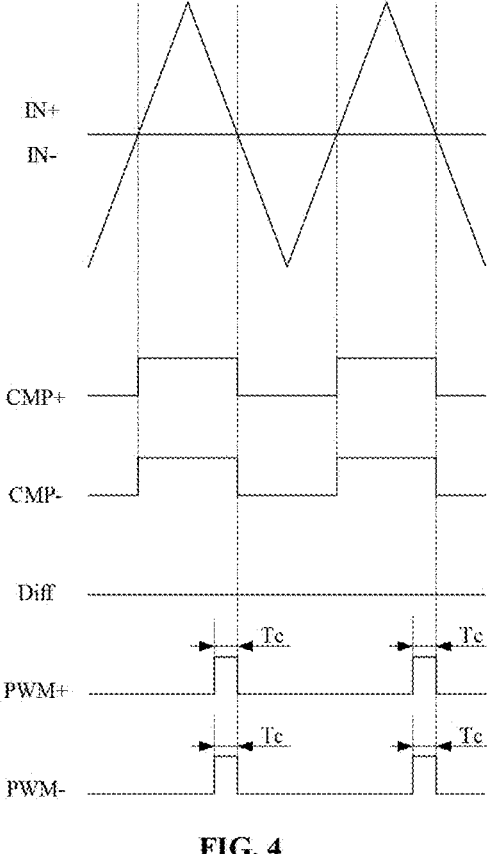
FIG. 4 is a schematic diagram of a PWM positive signal and a PWM negative signal when an amplitude of an input signal is equal to 0 in another embodiment of the present disclosure.

In another example, based on a schematic diagram of the second positive signal and the second negative signal as shown in FIG. 4, a signal segment in which a first positive signal IN+ (first negative signal IN−) is larger than the triangular wave corresponds to a low level of a second positive signal CMP+ (second negative signal CMP−), and a signal segment in which the first positive signal IN+ (the first negative signal IN−) is smaller than the triangular wave corresponds to a high level of the second positive signal CMP+ (the second negative signal CMP−).

It should be noted that FIGS. 3 and 4 show the triangular wave in two pulse periods. For ease of description, in subsequent embodiments, unless otherwise specified, the first positive signal is represented by IN+, the first negative signal is represented by IN−, the second positive signal is represented by CMP+, and the second negative signal is represented by CMP−, the PWM positive signal is represented by PWM+, and the PWM negative signal is represented by PWM−.

When the IN+ and IN− signals are compared with the triangular wave to generate the CMP+ and the CMP−, inverse operation may be performed, or may not be performed. When inverse operation is not performed, waveforms of the CMP+ and the CMP− are as shown in FIG. 3. When inverse operation is performed, waveforms of the CMP+ and the CMP− are as shown in FIG. 4. Whether inverse operation is performed in the process of generating the CMP+ and the CMP− may be set based on application scenario requirements, thereby satisfying different requirements, and improving the applicability of the method for signal processing in embodiments of the present disclosure.

Step 203: generating a PWM positive signal and a PWM negative signal based on the second positive signal, the second negative signal, and a second threshold.

After the second positive signal and the second negative signal are generated, logical operation may be performed on the second positive signal and the second negative signal based on the second threshold, and then the PWM positive signal and the PWM negative signal may be generated.

In an embodiment of the present disclosure, the positive output signal and the negative output signal are generated based on the PWM positive signal and the PWM negative signal, and when the absolute value of the amplitude of the input signal is larger than the first threshold and smaller than the first threshold, the PWM positive signal and the PWM negative signal are each generated based on the second positive signal, the second negative signal, and the second threshold. The PWM positive signal and the PWM negative signal are generated by feedback without the need of using a complex feedback network, so that signal processing is simpler, thereby reducing the costs of the circuit for signal processing.

In a possible implementation, when the amplitude of the input signal is equal to 0, each of the PWM positive signal and the PWM negative signal includes 1 pulse with a pulse width equal to the second threshold, and falling edges of pulses included in the PWM positive signal and the PWM negative signal are all temporally aligned to falling edges of pulses included in the second positive signal and the second negative signal.

The pulses included in the second positive signal and the second negative signal may be low levels, or may be high levels. In the second positive signal and the second negative signal, if the pulses are low levels, front edges of the pulses are falling edges, and back edges of the pulses are rising edges. If the pulses are high levels, the front edges of the pulses are rising edges, and the back edges of the pulses are falling edges. The PWM positive signal and the PWM negative signal are described below taking the pulses included in the second positive signal (the second negative signal) being low levels or high levels as an example.

When inverse operation is not performed in a process of generating the CMP+ and the CMP−, the PWM positive signal and the PWM negative signal are as shown in FIG. 3. Pulses included in the CMP+ and the CMP− are low levels, pulses included in the PWM+ and the PWM− are high levels, a differential mode signal Diff of the CMP+ and the CMP− does not include a pulse, falling edges of the pulses included in the PWM+ and the PWM− are temporally aligned to falling edges (front edges) of the pulses included in the CMP+ and the CMP−, and pulse widths of the pulses included in the PWM+ and the PWM− are each equal to the second threshold $T_c$.

When inverse operation is performed in the process of generating the CMP+ and the CMP−, the PWM positive signal and the PWM negative signal are as shown in FIG. 4. Pulses included in the CMP+ and the CMP− are high levels, pulses included in the PWM+ and the PWM− are high levels, a differential mode signal Diff of the CMP+ and the CMP− does not include a pulse, falling edges of the pulses included in the PWM+ and the PWM− are temporally aligned to falling edges (back edges) of the pulses included in the CMP+ and the CMP−, and the pulse widths of the pulses included in the PWM+ and the PWM− are each equal to the second threshold $T_c$.

It should be noted that FIGS. 3 and 4 show the PWM+ and the PWM− in two pulse periods.

In an embodiment of the present disclosure, when the amplitude of the input signal is equal to 0, the pulse widths of the pulses included in the PWM positive signal and the PWM negative signal are equal to the second threshold, and falling edges of the pulses included in the PWM positive signal and the PWM negative signal are all temporally aligned to falling edges of the pulses included in the second positive signal and the second negative signal, to ensure that the differential mode signal of the PWM positive signal and the PWM negative signal does not include any pulse, so that the differential mode signal of the PWM positive signal and the PWM negative signal matches the input signal, thereby ensuring the accuracy of signal processing. In addition, a small second threshold is set, so that the pulse widths of the pulses included in the PWM positive signal and the PWM negative signal are small when the amplitude of the input signal is equal to 0, thereby reducing the standby power consumption while ensuring the suppression effects on the loop nonlinearity and noise.

In a possible implementation, when the absolute value of the amplitude of the input signal is larger than 0 and smaller than the first threshold, each of the PWM positive signal and the PWM negative signal includes 2 pulses within one pulse period, and falling edges of the 2 pulses included in the PWM positive signal are temporally aligned to falling edges of the 2 pulses included in the PWM negative signal respectively. Based on the magnitude relationship between the first positive signal and the first negative signal, the pulse widths of the pulses included in the PWM positive signal are different from the pulse widths of the pulses included in the PWM negative signal.

Figure 5:
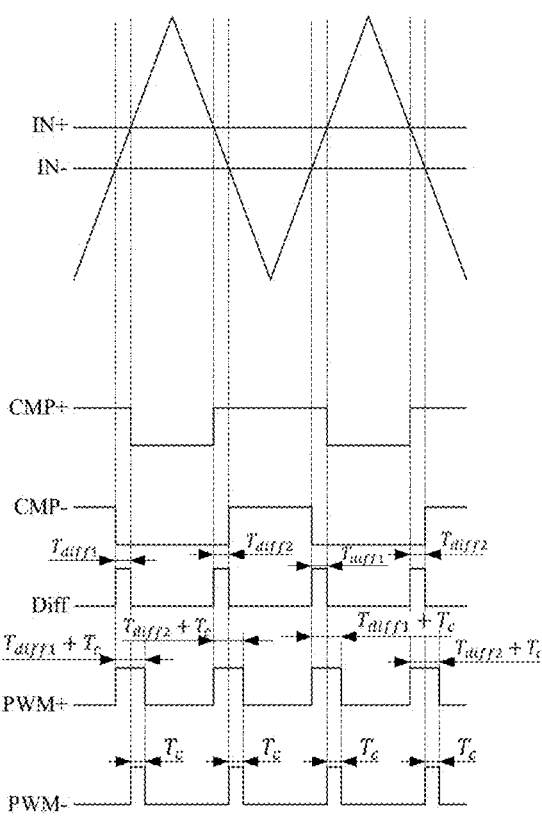
FIG. 5 is a schematic diagram of a PWM positive signal and a PWM negative signal when an absolute value of an amplitude of an input signal is smaller than a first threshold in an embodiment of the present disclosure.

When inverse operation is not performed in the process of generating the CMP+ and the CMP−, that is, when the pulses included in the CMP+ and the CMP− are low levels, if the absolute value of the amplitude of the input signal is larger than 0 and smaller than the first threshold, and the IN+ is larger than the IN−, the PWM+ and the PWM− are as shown in FIG. 5. Referring to FIG. 5, the pulses included in the CMP+ and the CMP− are low levels, the pulses included in the PWM+ and the PWM− are high levels, pulse widths of 2 pulses included in the PWM+ are $T_{diff1}+T_c$ and $T_{diff2}+T_c$ respectively, and pulse widths of 2 pulses included in the PWM− are each $T_c$. A rising edge of a pulse with the pulse width $T_{diff1}+T_c$ included in the PWM+ is temporally aligned to a falling edge of a pulse included in the CMP−, and a rising edge of a pulse with the pulse width $T_{diff2}+T_c$ included in the PWM+ is temporally aligned to a rising edge of a pulse included in the CMP+. A rising edge of 1 pulse included in the PWM− is temporally aligned to a falling edge of a pulse included in the CMP+, and a rising edge of the other pulse included in the PWM− is temporally aligned to a rising edge of a pulse included in the CMP−.

Figure 6:
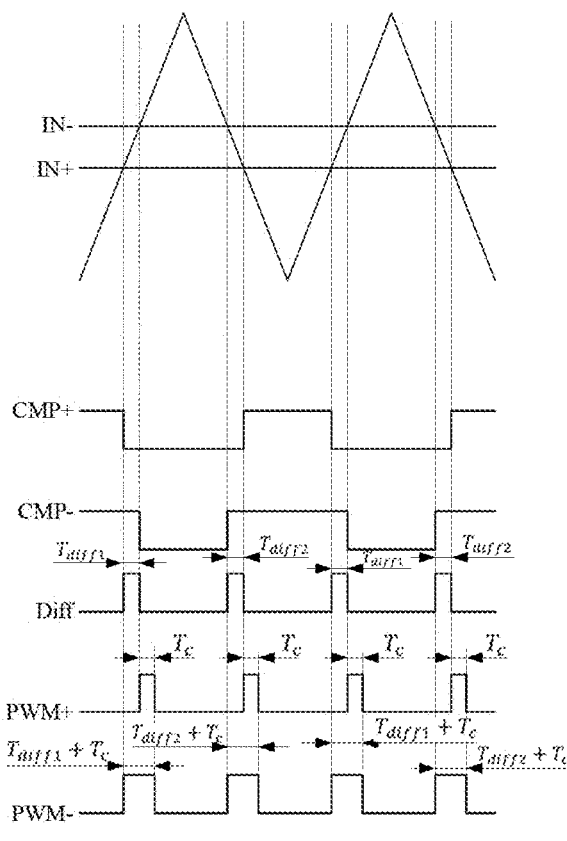
FIG. 6 is a schematic diagram of a PWM positive signal and a PWM negative signal when an absolute value of an amplitude of an input signal is smaller than a first threshold in another embodiment of the present disclosure.

When inverse operation is not performed in the process of generating the CMP+ and the CMP−, that is, when the pulses included in the CMP+ and the CMP− are low levels, if the absolute value of the amplitude of the input signal is larger than 0 and smaller than the first threshold, and the IN+ is smaller than the IN−, the PWM+ and the PWM− are as shown in FIG. 6. Referring to FIG. 6, the pulses included in the CMP+ and the CMP− are low levels, the pulses included in the PWM+ and the PWM− are high levels, pulse widths of 2 pulses included in the PWM+ are each $T_c$, and pulse widths of 2 pulses included in the PWM− are $T_{diff1}+T_c$ and $T_{diff2}+T_c$ respectively. A rising edge of a pulse with the pulse width $T_{diff1}+T_c$ included in the PWM− is temporally aligned to a falling edge of a pulse included in the CMP+, and a rising edge of a pulse with the pulse width $T_{diff2}+T_c$ included in the PWM− is temporally aligned to a rising edge of a pulse included in the CMP−. A rising edge of 1 pulse included in the PWM+ is temporally aligned to a falling edge of a pulse included in the CMP−, and a rising edge of the other pulse included in the PWM+ is temporally aligned to a rising edge of a pulse included in the CMP+.

Figure 7:
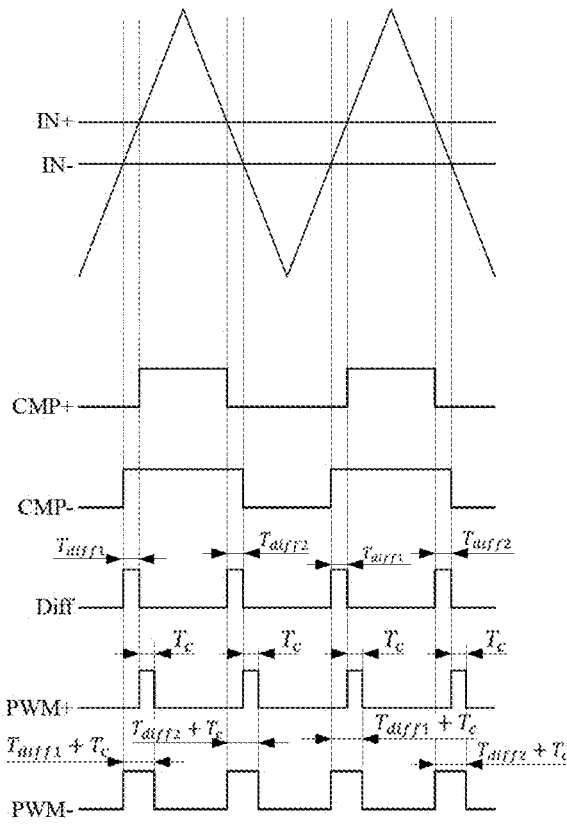
FIG. 7 is a schematic diagram of a PWM positive signal and a PWM negative signal when an absolute value of an amplitude of an input signal is smaller than a first threshold in still another embodiment of the present disclosure.

When inverse operation is performed in the process of generating the CMP+ and the CMP−, that is, when the pulses included in the CMP+ and the CMP− are high levels, if the absolute value of the amplitude of the input signal is larger than 0 and smaller than the first threshold, and the IN+ is larger than the IN−, the PWM+ and the PWM− are as shown in FIG. 7. Referring to FIG. 7, the pulses included in the CMP+ and the CMP− are high levels, the pulses included in the PWM+ and the PWM− are high levels, pulse widths of 2 pulses included in the PWM+ are each $T_c$, and pulse widths of 2 pulses included in the PWM− are $T_{diff1}+T_c$ and $T_{diff2}+T_c$ respectively. A rising edge of a pulse with the pulse width $T_{diff1}+T_c$ included in the PWM− is temporally aligned to a rising edge of a pulse included in the CMP−, and a rising edge of a pulse with the pulse width $T_{diff2}+T_c$ included in the PWM− is temporally aligned to a falling edge of a pulse included in the CMP+. A rising edge of 1 pulse included in the PWM+ is temporally aligned to a rising edge of a pulse included in the CMP+, and a rising edge of the other pulse included in the PWM+ is temporally aligned to a falling edge of a pulse included in the CMP−.

Figure 8:
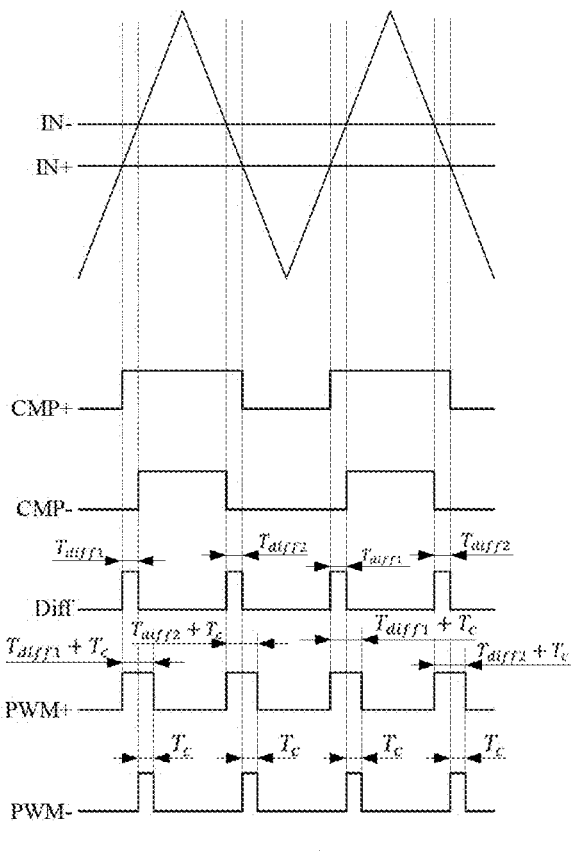
FIG. 8 is a schematic diagram of a PWM positive signal and a PWM negative signal when an absolute value of an amplitude of an input signal is smaller than a first threshold in yet another embodiment of the present disclosure.

When inverse operation is performed in the process of generating the CMP+ and the CMP−, that is, when the pulses included in the CMP+ and the CMP− are high levels, if the absolute value of the amplitude of the input signal is larger than 0 and smaller than the first threshold, and the IN+ is smaller than the IN−, the PWM+ and the PWM− are as shown in FIG. 8. Referring to FIG. 8, the pulses included in the CMP+ and the CMP− are high levels, the pulses included in the PWM+ and the PWM− are high levels, pulse widths of 2 pulses included in the PWM+ are $T_{diff\ 1}+T_c$ and $T_{diff2}+T_c$ respectively, and pulse widths of 2 pulses included in the PWM− are each $T_c$. A rising edge of a pulse with the pulse width $T_{diff\ 1}+T_c$ included in the PWM+ is temporally aligned to a rising edge of a pulse included in the CMP+, and a rising edge of a pulse with the pulse width $T_{diff\ 2}+T_c$ included in the PWM+ is temporally aligned to a falling edge of a pulse included in the CMP−. A rising edge of 1 pulse included in the PWM− is temporally aligned to a rising edge of a pulse included in the CMP−, and a rising edge of the other pulse included in the PWM− is temporally aligned to a falling edge of a pulse included in the CMP+.

It should be noted that FIGS. 5-8 show the PWM+ and the PWM− in two pulse periods, wherein the Diff is used to represent the differential mode signal of the CMP+ and the CMP−, and the $T_{diff\ 1}$ and the $T_{diff\ 2}$ are used to represent pulse widths of 2 pulses included in the Diff.

When inverse operation is not performed in the process of generating the CMP+ and the CMP−, and when the absolute value of the amplitude of the input signal is larger than 0 and smaller than the first threshold, if the IN+ is larger than the IN−, referring to FIG. 5, as the absolute value of the amplitude of the input signal increases, the $T_{diff\ 1}$ and the $T_{diff\ 2}$ increase, a pulse width of a pulse included in the PWM+ increases from $T_c$, a pulse width of a pulse included in the PWM− remains unchanged ($T_c$), and a sum of pulse widths of pulses included in the differential mode signal of the PWM+ and the PWM− is equal to $T_{diff\ 1}+T_{diff\ 2}$.

When inverse operation is not performed in the process of generating the CMP+ and the CMP−, and when the absolute value of the amplitude of the input signal is larger than 0 and smaller than the first threshold, if the IN+ is smaller than the IN−, referring to FIG. 6, as the absolute value of the amplitude of the input signal increases, the $T_{diff\ 1}$ and the $T_{diff\ 2}$ increase, a pulse width of a pulse included in the PWM+ remains unchanged ($T_c$), a pulse width of a pulse included in the PWM− increases from $T_c$, and the sum of the pulse widths of the pulses included in the differential mode signal of the PWM+ and the PWM− is equal to $T_{diff\ 1}+T_{diff\ 2}$.

When inverse operation is performed in the process of generating the CMP+ and the CMP−, and when the absolute value of the amplitude of the input signal is larger than 0 and smaller than the first threshold, if the IN+ is larger than the IN−, referring to FIG. 7, as the absolute value of the amplitude of the input signal increases, the $T_{diff\ 1}$ and the $T_{diff\ 2}$ increase, a pulse width of a pulse included in the PWM+ remains unchanged ($T_c$), a pulse width of a pulse included in the PWM− increases from $T_c$, and the sum of the pulse widths of the pulses included in the differential mode signal of the PWM+ and the PWM− is equal to $T_{diff\ 1}+T_{diff\ 2}$.

When inverse operation is performed in the process of generating the CMP+ and the CMP−, and when the absolute value of the amplitude of the input signal is larger than 0 and smaller than the first threshold, if the IN+ is smaller than the IN−, referring to FIG. 8, as the absolute value of the amplitude of the input signal increases, the $T_{diff\ 1}$ and the $T_{diff\ 2}$ increase, a pulse width of a pulse included in the PWM+ increases from $T_c$, a pulse width of a pulse included in the PWM− remains unchanged ($T_c$), and the sum of the pulse widths of the pulses included in the differential mode signal of the PWM+ and the PWM− is equal to $T_{diff\ 1}+T_{diff\ 2}$.

In an embodiment of the present disclosure, when the absolute value of the amplitude of the input signal is larger than 0 and smaller than the first threshold, each of the PWM+ and the PWM− includes 2 pulses, the sum of the pulse widths of the differential mode signal of the PWM+ and the PWM− is equal to $T_{diff\ 1}+T_{diff\ 2}$, and when the absolute value of the amplitude of the input signal changes, the $T_{diff1}+T_{diff2}$ changes accordingly, so that the input signal changes can be reflected in the differential mode signal of the PWM+ and the PWM−, thereby ensuring the accuracy of signal processing. In addition, each of the pulses included in the PWM+ and the PWM− is greater than or equal to $T_c$, so that the power output module can respond to the PWM+ and the PWM−, thereby ensuring the suppression effects on the loop nonlinearity and noise.

In a possible implementation, when the absolute value of the amplitude of the input signal is larger than the first threshold, based on the magnitude relationship between the first positive signal and the first negative signal, the pulse widths of the pulses included in the PWM positive signal are different from the pulse widths of the pulses included in the PWM negative signal.

Figure 9:
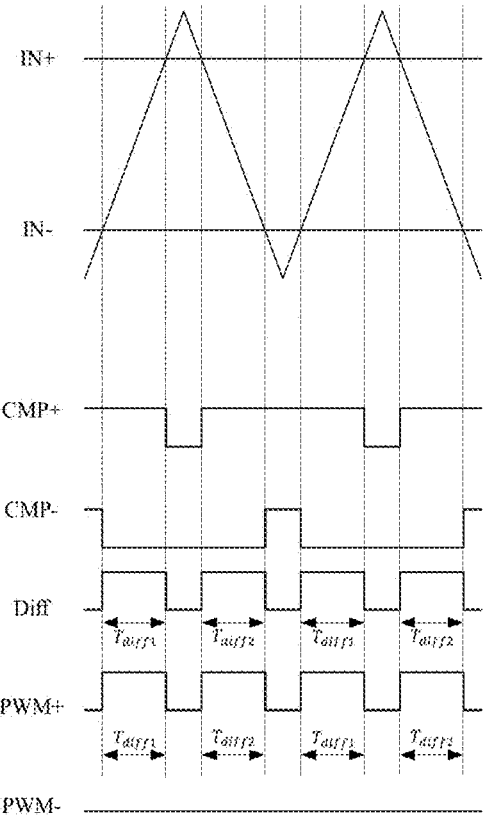
FIG. 9 is a schematic diagram of a PWM positive signal and a PWM negative signal when an absolute value of an amplitude of an input signal is larger than a first threshold in an embodiment of the present disclosure.

When inverse operation is not performed in the process of generating the CMP+ and the CMP−, that is, when the pulses included in the CMP+ and the CMP− are low levels, if the absolute value of the amplitude of the input signal is larger than the first threshold, and the IN+ is larger than the IN−, the PWM+ and the PWM− are as shown in FIG. 9. Referring to FIG. 9, the pulses included in the CMP+ and the CMP− are low levels, the pulses included in the PWM+ are high levels, pulse widths of 2 pulses included in the PWM+ are $T_{diff\ 1}$ and $T_{diff\ 2}$ respectively, and the PWM− does not include a pulse. A rising edge of a pulse with the pulse width $T_{diff\ 1}$ included in the PWM+ is temporally aligned to a falling edge of a pulse included in the CMP−, and a falling edge of a pulse with the pulse width $T_{diff\ 1}$ included in the PWM+ is temporally aligned to a falling edge of a pulse included in the CMP+. A rising edge of a pulse with the pulse width $T_{diff\ 2}$ included in the PWM+ is temporally aligned to a rising edge of a pulse included in the CMP+, and a falling edge of a pulse with the pulse width $T_{diff\ 2}$ included in the PWM+ is temporally aligned to a rising edge of a pulse included in the CMP−.

Figure 10:
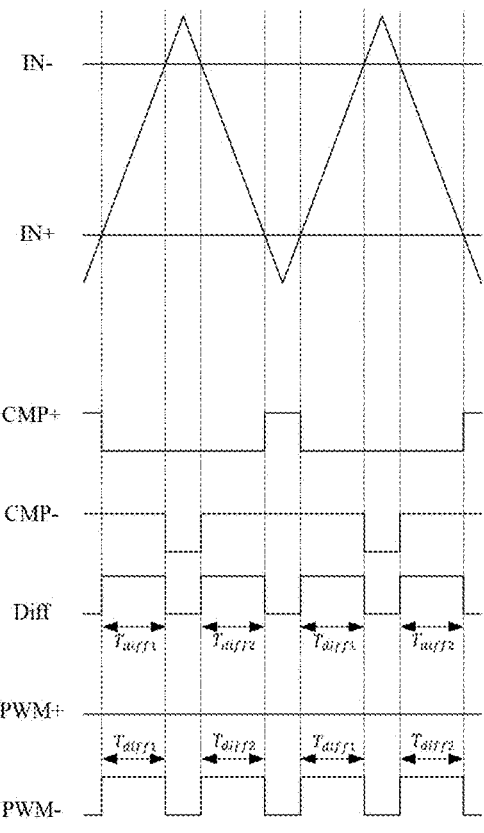
FIG. 10 is a schematic diagram of a PWM positive signal and a PWM negative signal when an absolute value of an amplitude of an input signal is larger than a first threshold in another embodiment of the present disclosure.

When inverse operation is not performed in the process of generating the CMP+ and the CMP−, that is, when the pulses included in the CMP+ and the CMP− are low levels, if the absolute value of the amplitude of the input signal is larger than the first threshold, and the IN+ is smaller than the IN−, the PWM+ and the PWM− are as shown in FIG. 10. Referring to FIG. 10, the pulses included in the CMP+ and the CMP− are low levels, the pulses included in the PWM− are high levels, the PWM+ does not include a pulse, and pulse widths of 2 pulses included in the PWM− are $T_{diff\ 1}$ and $T_{diff\ 2}$ respectively. A rising edge of a pulse with the pulse width $T_{diff\ 1}$ included in the PWM− is temporally aligned to a falling edge of a pulse included in the CMP+, and a falling edge of a pulse with the pulse width $T_{diff\ 1}$ included in the PWM− is temporally aligned to a falling edge of a pulse included in the CMP−. A rising edge of a pulse with the pulse width $T_{diff\ 2}$ included in the PWM− is temporally aligned to a rising edge of a pulse included in the CMP−, and a falling edge of a pulse with the pulse width $T_{diff\ 2}$ included in the PWM− is temporally aligned to a rising edge of a pulse included in the CMP+.

Figure 11:
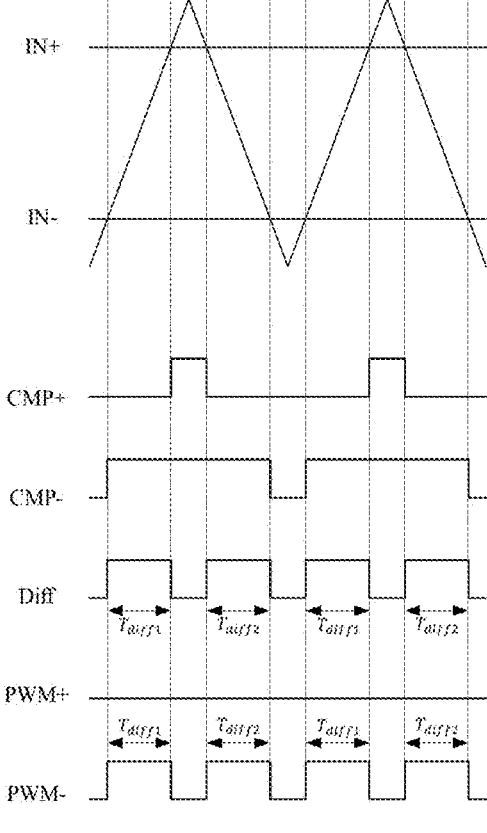
FIG. 11 is a schematic diagram of a PWM positive signal and a PWM negative signal when an absolute value of an amplitude of an input signal is larger than a first threshold in still another embodiment of the present disclosure.

When inverse operation is performed in the process of generating the CMP+ and the CMP−, that is, when the pulses included in the CMP+ and the CMP− are high levels, if the absolute value of the amplitude of the input signal is larger than the first threshold, and the IN+ is larger than the IN−, the PWM+ and the PWM− are as shown in FIG. 11. Referring to FIG. 11, the pulses included in the CMP+ and the CMP− are high levels, the pulses included in the PWM− are high levels, the PWM+ does not include a pulse, and pulse widths of 2 pulses included in the PWM− are $T_{diff\ 1}$ and $T_{diff\ 2}$ respectively. A rising edge of a pulse with the pulse width $T_{diff\ 1}$ included in the PWM− is temporally aligned to a rising edge of a pulse included in the CMP−, and a falling edge of a pulse with the pulse width $T_{diff\ 1}$ included in the PWM− is temporally aligned to a rising edge of a pulse included in the CMP+. A rising edge of a pulse with the pulse width $T_{diff\ 2}$ included in the PWM− is temporally aligned to a falling edge of a pulse included in the CMP+, and a falling edge of a pulse with the pulse width $T_{diff\ 2}$ included in the PWM− is temporally aligned to a falling edge of a pulse included in the CMP−.

Figure 12:
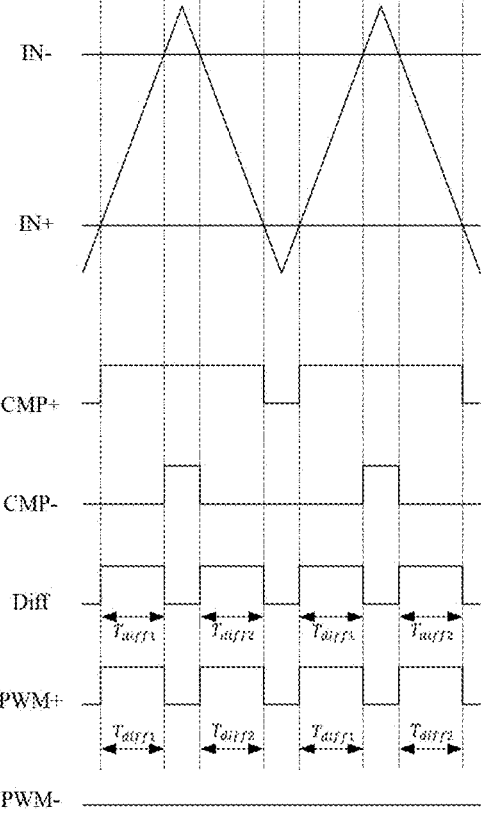
FIG. 12 is a schematic diagram of a PWM positive signal and a PWM negative signal when an absolute value of an amplitude of an input signal is larger than a first threshold in yet an embodiment of the present disclosure.

When inverse operation is performed in the process of generating the CMP+ and the CMP−, that is, when the pulses included in the CMP+ and the CMP− are high levels, if the absolute value of the amplitude of the input signal is larger than the first threshold, and the IN+ is smaller than the IN−, the PWM+ and the PWM− are as shown in FIG. 12. Referring to FIG. 12, the pulses included in the CMP+ and the CMP− are high levels, the pulses included in the PWM+ are high levels, the PWM− does not include a pulse, and pulse widths of 2 pulses included in the PWM+ are $T_{diff\ 1}$ and $T_{diff\ 2}$ respectively. A rising edge of a pulse with the pulse width $T_{diff\ 1}$ included in the PWM+ is temporally aligned to a rising edge of a pulse included in the CMP+, and a falling edge of a pulse with the pulse width $T_{diff\ 1}$ included in the PWM+ is temporally aligned to a rising edge of a pulse included in the CMP−. A rising edge of a pulse with the pulse width $T_{diff\ 2}$ included in the PWM+ is temporally aligned to a falling edge of a pulse included in the CMP−, and a falling edge of a pulse with the pulse width $T_{diff\ 2}$ included in the PWM+ is temporally aligned to a falling edge of a pulse included in the CMP+.

It should be noted that FIGS. 5-8 show the PWM+ and the PWM− in two pulse periods, wherein the Diff is used to represent the differential mode signal of the CMP+ and the CMP−, and the $T_{diff\ 1}$ and the $T_{diff\ 2}$ are used to represent pulse widths of 2 pulses included in the Diff. Referring to FIGS. 9-12, when the absolute value of the amplitude of the input signal is larger than the first threshold, as the absolute value of the amplitude of the input signal increases, the $T_{diff\ 1}$ and the $T_{diff\ 2}$ increase, a pulse width of a pulse included in the PWM+ or the PWM− increases from $2T_c$, and the sum of the pulse widths of the pulses included in the differential mode signal of the PWM+ and the PWM− is equal to $T_{diff\ 1} + T_{diff\ 2}$.

In an embodiment of the present disclosure, when the absolute value of the amplitude of the input signal is larger than the first threshold, one of the PWM+ and the PWM− includes 2 pulses, and the other one thereof does not include a pulse. On the premise that the triangular wave is at a certain frequency, the PWM+ or the PWM− includes 2 pulses within one pulse period, thereby improving the suppression effects on the loop nonlinearity and noise, and improving the performance of the output signal. One of the PWM+ and the PWM− includes a pulse, while the other one thereof does not include a pulse, that is, the PWM+ and the PWM− do not have a common mode component, and a differential signal of the PWM+ and the PWM− is concentrated on a single side, so that the differential mode pulse width of the PWM+ and the PWM− has no losses. Since the pulses included in the positive output signal and the negative output signal are generated based on switching of a switching tube in the circuit, one of the positive output signal and the negative output signal does not include a pulse within one pulse period, the other one of the positive output signal and the negative output signal includes 2 pulses, thereby increasing the occurrence frequency of pulses without increasing the switching frequency of the switching tube compared to the case where each of the positive output signal and the negative output signal includes 1 pulse, and improving the performance of the output signal while ensuring the output efficiency. In the PWM process, the number of occurrences of pulses per unit time is positively correlated to the suppression effects on the loop nonlinearity and noise. When the absolute value of the amplitude of the input signal is larger than the first threshold, one of the positive output signal and the negative output signal includes 2 pulses within one pulse period, thereby improving the suppression effects on the loop nonlinearity and noise when the absolute value of the amplitude of the input signal is large, and improving the performance of the output signal.

In a possible implementation, when the PWM+ and the PWM− are generated based on the CMP+, the CMP−, and the second threshold $T_c$, logical operation can be performed on the CMP+ and the CMP− after inverse delaying, to obtain the PWM+ and the PWM−. FIG. 13 shows a flow chart of a method for generating PWM+ and PWM− in an embodiment of the present disclosure. As shown in FIG. 13, the method includes the following steps:

Step 1301: delaying a second positive signal for a preset delay duration, and then performing logical NOT operation to obtain a first delayed inversion signal;

Step 1302: performing logical NOR operation on the first delayed inversion signal and the second negative signal to obtain a third positive signal;

Step 1303: determining, in response to a pulse width of a pulse included in the third positive signal being larger than a second threshold, the third positive signal as a fourth positive signal, and temporally backward increasing, in response to the pulse width of the pulse included in the third positive signal being smaller than the second threshold, the pulse width of the pulse included in the third positive signal by the second threshold to obtain a fourth positive signal;

Step 1304: delaying a second negative signal for the preset delay duration, and then performing logical NOT operation to obtain a second delayed inversion signal;

Step 1305: performing logical NOR operation on the second delayed inversion signal and the second positive signal to obtain a third negative signal;

Step 1306: determining, in response to a pulse width of a pulse included in the third negative signal being larger than the second threshold, the third negative signal as a fourth negative signal, and temporally backward increasing, in response to the pulse width of the pulse included in the third negative signal being smaller than the second threshold, the pulse width of the pulse included in the third negative signal by the second threshold to obtain a fourth negative signal;

Step 1307: performing logical OR operation on the fourth positive signal and the fourth negative signal to obtain a fifth signal;

Step 1308: performing logical OR operation on the third positive signal and the fifth signal to obtain the PWM positive signal; and Step 1309: performing logical OR operation on the third negative signal and the fifth signal to obtain the PWM negative signal.

It should be noted that the steps 1301-1303 are sequentially executed, the steps 1304-1306 are sequentially executed, and the steps 1301-1303 may be executed synchronously with the steps 1304-1306.

When the amplitude of the input signal is equal to 0, the differential mode signal of the CMP+ and the CMP− does not include a pulse. After the logical NOT operation, the CMP+ and the CMP− are delayed for the preset delay duration, to generate the first delayed inversion signal and the second delayed inversion signal respectively, and the first delayed inversion signal and the second delayed inversion signal serve as trigger signals of the common mode pulse width when the amplitude of the input signal is equal to 0, thereby enabling the PWM+ and the PWM− to include pulses with pulse widths equal to the second threshold $T_c$ based on the first delayed inversion signal and the second delayed inversion signal, ensuring normal running of the feedback loop during signal processing, and ensuring the performance of signal processing.

When the absolute value of the amplitude of the input signal is larger than 0, the differential mode signal of the CMP+ and the CMP− includes a pulse, so that the delay duration is set to generate a trigger signal of the common mode pulse width when the amplitude of the input signal is equal to 0. Therefore, a small delay duration can satisfy the requirements, and a value range of the delay duration may be [1 ns, 10 ns]. For example, the delay duration may be set to 5 ns, wherein the ns is nanosecond.

Figure 14:
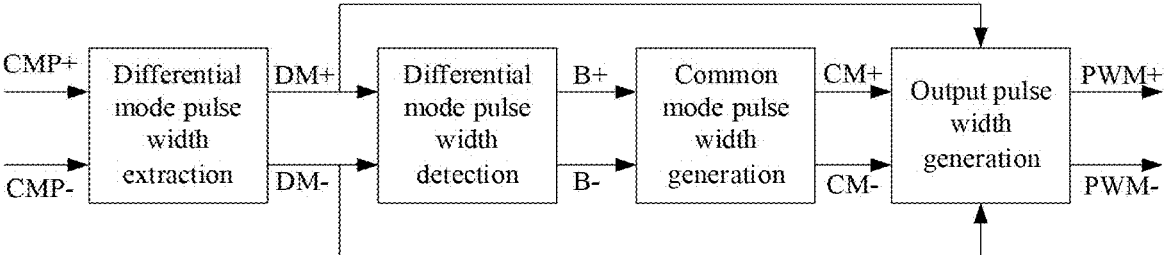
FIG. 14 is a schematic diagram of a process of generating a PWM positive signal and a PWM negative signal in an embodiment of the present disclosure.

In a possible implementation, FIG. 14 shows a schematic diagram of a process of generating a PWM+ and a PWM− in an embodiment of the present disclosure. As shown in FIG. 14, the generating the PWM+ and the PWM− includes processes, such as differential mode pulse width extraction, differential mode pulse width detection, common mode pulse width generation, and output pulse width generation.

The process of differential mode pulse width extraction includes performing differential mode pulse width extraction on the CMP+ and the CMP−, to obtain a first positive differential mode signal DM+ and a first negative differential mode signal DM−.

The process of differential mode pulse width detection includes performing differential mode pulse width detection on the first positive differential mode signal DM+ and the first negative differential mode signal DM−, to obtain a second positive differential mode signal B+ and a second negative differential mode signal B−.

The process of common mode pulse width generation includes performing common mode pulse width generation based on the second positive differential mode signal B+ and the second negative differential mode signal B−, to obtain a positive common mode signal CM+ and a negative common mode signal CM−.

The process of differential mode pulse width generation includes performing PWM signal generation based on the first positive differential mode signal DM+, the first negative differential mode signal DM−, the positive common mode signal CM+, the negative common mode signal CM−, and the preset second threshold, to obtain the PWM+ and the PWM−.

In an embodiment of the present disclosure, the PWM+ and the PWM− are obtained by performing, e.g., differential mode pulse width extraction, differential mode pulse width detection, common mode pulse width generation, and output pulse width generation based on the CMP+ and the CMP−. The pulse widths of the CMP+ and the CMP− can be determined by differential mode pulse width detection, and then the PWM+ and the PWM− are generated without increasing the common mode pulse width or by additionally providing a common mode module of a fixed size based on the pulse widths of the CMP+ and the CMP−, to ensure the quality of signal processing.

In a possible implementation, the absolute value of the amplitude of the input signal may be classified into 3 segments based on the preset first threshold, the amplitude of the input signal equal to 0 is defined as the standby state, the absolute value of the amplitude of the input signal larger than 0 and smaller than the first threshold is defined as a small amplitude segment, and the absolute value of the amplitude of the input signal larger than the first threshold is defined as a large amplitude segment. As can be seen from FIGS. 3-12 and the description of the above text, a critical condition from the standby state to the small amplitude segment is that the pulse widths of the pulses included in the PWM+ become different from the pulse widths of the pulses included in the PWM−, and a critical condition from the small amplitude segment to the large amplitude segment is that only 1 of the PWM+ and the PWM− includes a pulse. In the small amplitude segment, pulse widths of 2 pulses included in the differential mode signal of the CMP+ and the CMP− satisfy $0 < T_{diff\_1} < T_c$ and $0 < T_{diff\_2} < T_c$. In the large amplitude segment, pulse widths of 2 pulses included in the differential mode signal of the CMP+ and the CMP− satisfy $T_c < T_{diff\_1} < T$ and $T_c < T_{diff\_2} < T$.

A value range of the second threshold $T_c$ is [T/40, T/10], wherein T is used to represent a duration of the pulse period. For example, the delay duration may be, e.g., T/40, T/30, T/20, or T/10.

It should be noted that the second threshold may be a preset constant value, or may be dynamically changing. For example, when the input signal is an analog signal or a digital signal, the second threshold is a preset constant value. When the input signal is a digital signal, the second threshold may be dynamically adjusted based on the power of the input signal, to balance between the performance of the output signal and the efficiency of signal processing.

In an example, the delay duration matches the frequency of the triangular wave. For example, when the frequency of the triangular wave is large, a small delay duration may be set, and when the frequency of the triangular wave is small, a large delay duration may be set.

In an embodiment of the present disclosure, when the amplitude of the input signal is equal to 0, a pulse width of a pulse included in the common mode signal of the PWM+ and the PWM− is negatively correlated to the efficiency of signal processing. Moreover, the power output module fails to respond when the pulse width of the pulse included in the PWM+ and the PWM− is too small. When the amplitude of the input signal is equal to 0, the pulse width of the pulse included in the PWM+ and the PWM− is determined based on the second threshold, so that the value range of the second threshold is set to [T/40, T/10], to ensure that the power output module can respond to the pulse included in the PWM+ and the PWM− when the amplitude of the input signal is equal to 0, and ensure low power consumption in the standby state.

In a possible implementation, when the positive output signal and the negative output signal are outputted based on the PWM+ and the PWM−, an amplitude of the PWM+ can be amplified to obtain the negative output signal, and an amplitude of the PWM− can be amplified to obtain the positive output signal, or an amplitude of the PWM+ can be amplified to obtain the positive output signal, and an amplitude of the PWM− can be amplified to obtain the negative output signal.

The amplifying the amplitudes of the PWM+ and the PWM− means to amplify amplitudes of pulses included in the PWM+ and the PWM− without changing the number, rising edge positions, and falling edge positions of the pulses included in the PWM+ and the PWM−. For example, a voltage corresponding to a pulse included in the PWM+ is 5V, and the amplitude of the PWM+ is amplified to 20V to obtain the positive output signal or the negative output signal.

When the positive output signal and the negative output signal are outputted based on the PWM+ and the PWM−, inverse operation may be performed, or may not be performed. If inverse operation is performed, the amplitude of the PWM+ is amplified to obtain the negative output signal, the amplitude of the PWM− is amplified to obtain the positive output signal. If inverse operation is not performed, the amplitude of the PWM+ is amplified to obtain thee positive output signal, and the amplitude of the PWM− is amplified to obtain the negative output signal.

It should be noted that in a process of processing the input signal to obtain the positive output signal and the negative output signal, an inverse operation is required. This inverse operation may be performed in a process of generating the IN+ and the IN− based on the input signal, or may be performed in a process of generating the CMP+ and the CMP− based on the IN+ and the IN−, or may be performed in a process of generating the PWM+ and the PWM− based on the CMP+ and the CMP−, or may be performed in a process of generating the positive output signal and the negative output signal based on the PWM+ and the PWM−.

In the above embodiments, a process of performing inverse operation in the process of generating the CMP+ and the CMP− based on the IN+ and the IN− is described. The implementations of performing inverse operation in the process of generating the IN+ and the IN− based on the input signal, performing inverse operation in the process of generating the PWM+ and the PWM− based on the CMP+ and the CMP−, and performing inverse operation in the process of generating the positive output signal and the negative output signal based on the PWM+ and the PWM− are similar to the process of performing inverse operation in the process of generating the CMP+ and the CMP− based on the IN+ and the IN−, and will not be repeated here.

In an embodiment of the present disclosure, when the positive output signal and the negative output signal are outputted based on the PWM+ and the PWM−, the amplitudes of the PWM+ and the PWM− are amplified to obtain the positive output signal and the negative output signal, so that the positive output signal and the negative output signal can drive a device, such as a speaker. In the process of outputting the positive output signal and the negative output signal based on the PWM+ and the PWM−, inverse operation may be performed, or may not be performed, thereby satisfying different application scenario requirements, and improving the applicability of the method for signal processing in the embodiments of the present disclosure.

In a possible implementation, the input signal may be an audio signal, the positive output signal and the negative output signal may be used to drive a speaker, and the speaker is configured to play the audio signal after signal processing. In an example, the positive output signal may be used as a positive terminal input of the speaker, and the negative output signal may be used as a negative terminal input of the speaker.

In an embodiment of the present disclosure, the audio signal is processed in accordance with the method for signal processing in the above embodiments, so that the audio signal processing is more efficient, thereby improving the efficiency without the need of using an advanced technology in the whole audio system, and improving the efficiency of signal processing in an audio system using an ordinary technology by optimizing the switching frequency and the switching mode.

Circuit for Signal Processing

Figure 15:
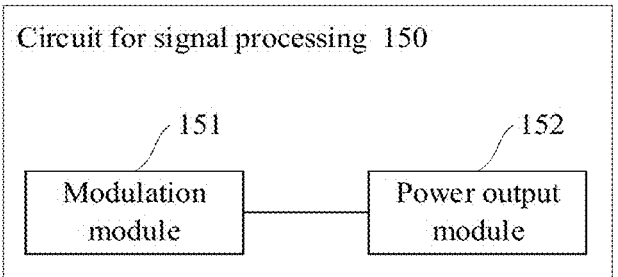
FIG. 15 is a schematic diagram of a circuit for signal processing in an embodiment of the present disclosure.

FIG. 15 shows a schematic diagram of a circuit for signal processing in an embodiment of the present disclosure. As shown in FIG. 15, the circuit 150 for signal processing includes a modulation module 151 and a power output module 152, wherein the modulation module 151 is configured to perform PWM modulation on an input signal to obtain a PWM positive signal and a PWM negative signal, and the power output module 152 is configured to output a positive output signal and a negative output signal based on the PWM positive signal and the PWM negative signal; wherein, in response to an absolute value of an amplitude of the input signal being larger than 0 and smaller than a first threshold, each of the positive output signal and the negative output signal includes 2 pulses within one pulse period, and pulse widths of the pulses included in the positive output signal are different from pulse widths of the pulses included in the negative output signal.

In an embodiment of the present disclosure, the modulation module 151 performs PWM modulation on the input signal to obtain the PWM positive signal and the PWM negative signal, and the power output module 152 outputs the positive output signal and the negative output signal based on the PWM positive signal and the PWM negative signal, wherein, when the absolute value of the amplitude of the input signal is larger than 0 and smaller than the first threshold, each of the positive output signal and the negative output signal includes 2 pulses within one pulse period, and the pulse widths of the pulses included in the positive output signal are different from the pulse widths of the pulses included in the negative output signal. When the absolute value of the amplitude of the input signal is larger than 0 and smaller than the first threshold, that is, the absolute value of the amplitude of the input signal is small, each of the positive output signal and the negative output signal outputted from a power output module includes 2 pulses, so that the positive output signal and the negative output signal are at high frequencies, so that the positive output signal and the negative output signal can be processed using a passive filter that supports high signal frequencies, and the passive filter that supports high signal frequencies is less expensive, thus reducing the costs of the system for signal processing.

In a possible implementation, in response to any one input signal with an absolute value of an amplitude falling within a range of (0, first threshold), a pulse width of a pulse included in one output signal of the positive output signal and the negative output signal outputted from the power output module 152 is equal to a second threshold, and a pulse width of a pulse included in the other output signal of the positive output signal and the negative output signal is larger than the second threshold.

In an embodiment of the present disclosure, the modulation module 151 performs PWM modulation on the input signal to obtain the PWM positive signal and the PWM negative signal, and the power output module 152 outputs the positive output signal and the negative output signal based on the PWM positive signal and the PWM negative signal. When the absolute value of the amplitude of the input signal is larger than 0 and smaller than the first threshold, each of the positive output signal and the negative output signal includes 2 pulses within one pulse period, a pulse width of a pulse included in one output signal of the positive output signal and the negative output signal is equal to the second threshold, and a pulse width of a pulse included in the other output signal of the positive output signal and the negative output signal is larger than the second threshold, that is, for any one input signal with an absolute value of an amplitude larger than 0 and smaller than the first threshold, there is always one corresponding output signal of the positive output signal and the negative output signal that includes a pulse with a pulse width equal to the second threshold, and the other output signal thereof includes a pulse with a pulse width larger than the second threshold, to ensure that a differential mode signal of the positive output signal and the negative output signal includes a pulse, so that the differential mode signal of the positive output signal and the negative output signal matches the amplitude of the input signal, to ensure the stability and accuracy of processing of the input signal.

Since a pulse width of the differential mode signal of the PWM positive signal and the PWM negative signal is positively correlated to the absolute value of the amplitude of the input signal, the pulse width of the differential mode signal of the PWM positive signal and the PWM negative signal is small when the absolute value of the amplitude of the input signal is small. When the absolute value of the amplitude of the input signal is larger than 0 and smaller than the first threshold, that is, when the absolute value of the amplitude of the input signal is small, the power output module can still respond to the differential mode signal of the PWM positive signal and the PWM negative signal, and output the positive output signal and the negative output signal each of which includes 2 pulses respectively, thereby feeding back the positive output signal and the negative output signal to the loop filter unit, ensuring the suppression effects of the loop on noise and system nonlinearity, and ensuring the quality of the processed signals.

Figure 16:
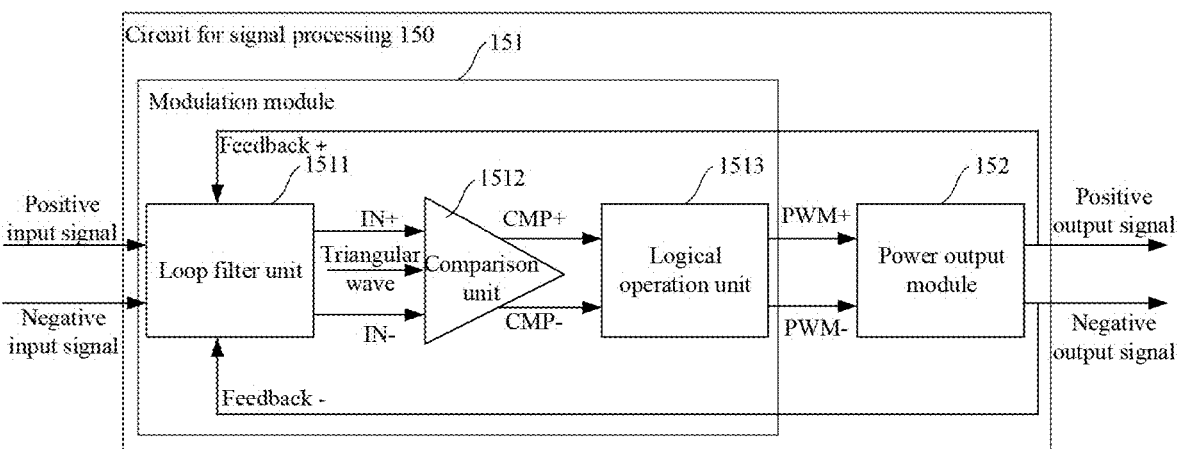
FIG. 16 is a schematic diagram of a circuit for signal processing in another embodiment of the present disclosure.

In a possible implementation, in the circuit 150 for signal processing as shown in FIG. 16, the modulation module 151 includes a loop filter unit 1511, a comparison unit 1512, and a logical operation unit 1513; wherein the loop filter unit 1511 is configured to filter the input signal to obtain a first positive signal and a first negative signal;

the comparison unit 1512 is configured to compare the first positive signal and the first negative signal with a triangular wave signal, and generate a second positive signal and a second negative signal based on a comparison result, wherein a period of the triangular wave is equal to the pulse period, and each of the second positive signal and the second negative signal is a square wave signal; and the logical operation unit 1513 is configured to generate the PWM positive signal and the PWM negative signal based on the second positive signal, the second negative signal, and the second threshold.

The positive output signal and the negative output signal outputted from the power output module 152 may be fed back to the loop filter unit 1511. The loop filter unit 1511 filters the positive input signal and the negative input signal based on the feedback signals from the power output module 152, to achieve loop filtering.

Figure 17:
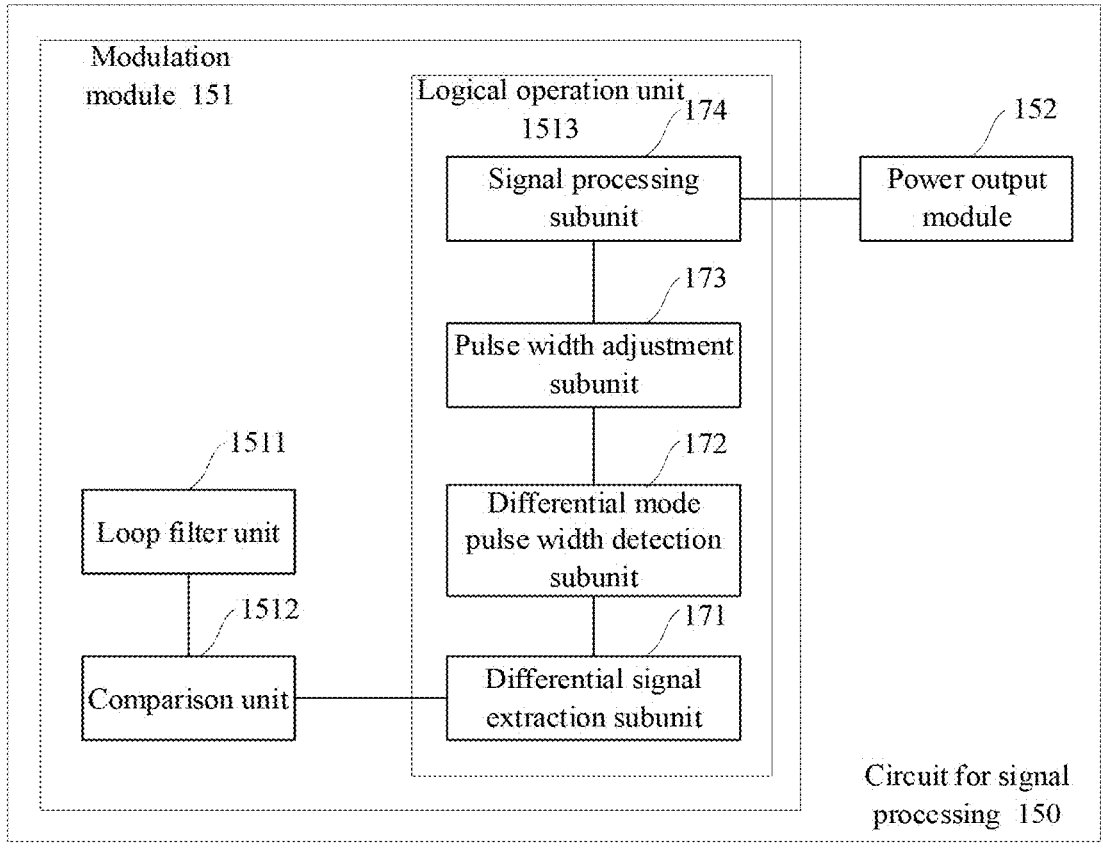
FIG. 17 is a schematic diagram of a circuit for signal processing in still another embodiment of the present disclosure.

In a possible implementation, in the circuit 150 for signal processing as shown in FIG. 17, the logical operation unit 1513 includes: a differential signal extraction subunit 171, a differential mode pulse width detection subunit 172, a pulse width adjustment subunit 173, and a signal processing subunit 174; wherein the differential signal extraction subunit 171 is configured to perform logical NOT operation on the second positive signal and then delay for a preset delay duration to obtain a first delayed inversion signal, perform logical NOR operation on the first delayed inversion signal and the second negative signal to obtain a third positive signal, perform logical NOT operation on the second negative signal and then delay for the preset delay duration to obtain a second delayed inversion signal, and perform logical NOR operation on the second delayed inversion signal and the second positive signal to obtain a third negative signal;

the differential mode pulse width detection subunit 172 is configured to detect a pulse width of a pulse included in the third positive signal and a pulse width of a pulse included in the third negative signal;

the pulse width adjustment subunit 173 is configured to determine, when the pulse width of the pulse included in the third positive signal being larger than the second threshold, the third positive signal as a fourth positive signal, temporally backward increase, when the pulse width of the pulse included in the third positive signal being smaller than the second threshold, the pulse width of the pulse included in the third positive signal by the second threshold to obtain a fourth positive signal, determine, when the pulse width of the pulse included in the third negative signal being larger than the second threshold, the third negative signal as a fourth negative signal, and temporally backward increase, when the pulse width of the pulse included in the third negative signal being smaller than the second threshold, the pulse width of the pulse included in the third negative signal by the second threshold to obtain a fourth negative signal; and the signal processing subunit 174 is configured to perform logical OR operation on the fourth positive signal and the fourth negative signal to obtain a fifth signal, perform logical OR operation on the third positive signal and the fifth signal to obtain the PWM positive signal, and perform logical OR operation on the third negative signal and the fifth signal to obtain the PWM negative signal.

In a possible implementation, the logical operation unit 1513 is configured to:

perform differential mode pulse width extraction on the second positive signal and the second negative signal to obtain a first positive differential mode signal and a first negative differential mode signal;

perform differential mode pulse width detection on the first positive differential mode signal and the first negative differential mode signal, to obtain a second positive differential mode signal and a second negative differential mode signal;

perform common mode pulse width generation based on the second positive differential mode signal and the second negative differential mode signal, to obtain a positive common mode signal and a negative common mode signal; and perform PWM signal generation based on the first positive differential mode signal, the first negative differential mode signal, the positive common mode signal, the negative common mode signal, and the second threshold, to obtain the PWM positive signal and the PWM negative signal.

It should be noted that the circuit for signal processing in the embodiments of the present disclosure is configured to implement the method for signal processing in the above embodiments, and is based on the same concept as the method for signal processing in the above embodiments. The method for signal processing in the above embodiments may be referred to for specific contents and beneficial effects, which will not be repeated here.

Chip for Signal Processing

An embodiment of the present disclosure provides a chip for signal processing. The chip for signal processing is configured to implement the method for signal processing in any one of the above embodiments. The chip for signal processing may include the circuit 150 for signal processing in any one of the above embodiments, that is, the circuit 150 for signal processing in the above embodiments is encapsulated in a chip, and the chip for signal processing may be arranged in an electronic device with signal processing requirements, such as audio signals or power supply signals, for signal processing.

It should be noted that the chip for signal processing in the embodiments of the present disclosure is configured to implement the method for signal processing in the above embodiments, and is based on the same concept as the method for signal processing in the above embodiments. The method for signal processing in the above embodiments may be referred to for specific contents and beneficial effects, which will not be repeated here.

Electronic Device

Figure 18:
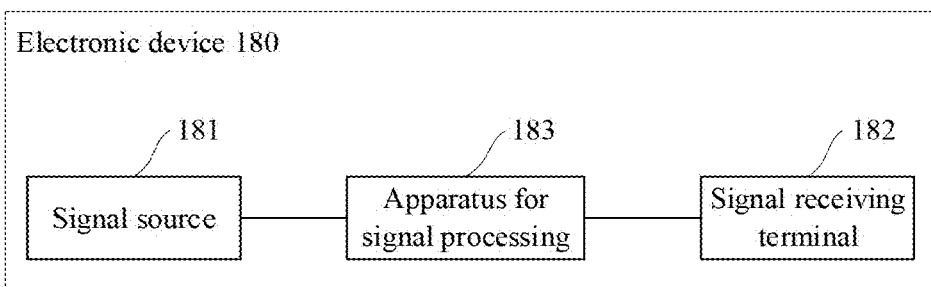
FIG. 18 is a schematic diagram of an electronic device in an embodiment of the present disclosure.

FIG. 18 shows a schematic diagram of an electronic device in an embodiment of the present disclosure. As shown in FIG. 18, the electronic device 180 includes a signal source 181, a signal receiving terminal 182, and an apparatus 183 for signal processing. The apparatus 183 for signal processing may include the circuit 150 for signal processing or the chip for signal processing in any one of the above embodiments.

The apparatus 183 for signal processing is connected between the signal source 181 and the signal receiving terminal 182, the signal source 181 is configured to transmit an input signal to the apparatus 183 for signal processing, and the signal receiving terminal 182 is configured to receive the positive output signal and the negative output signal outputted from the apparatus 183 for signal processing.

The input signal transmitted from the signal source 181 to the apparatus 183 for signal processing may be an audio signal. After receiving the positive output signal and the negative output signal, the signal receiving terminal 182 may perform LC filtering on the positive output signal and the negative output signal, and then transmit the filtered signals to a speaker, to drive the speaker to produce sound.

It should be noted that the electronic device in the embodiments of the present disclosure is implemented based on the circuit 150 for signal processing or the chip for signal processing in the above embodiments, and is a specific application of the circuit 150 for signal processing or the chip for signal processing in the above embodiments. The description of the signal processing unit in the above embodiments and the chip for signal processing in the above embodiments may be referred to for specific contents and beneficial effects, which will not be repeated here.

It should be understood that the embodiments in the present specification are described progressively, identical or similar portions between the embodiments may be mutually referred to, and differences of each embodiment from other embodiments are mainly described in the embodiment. In particular, the method embodiments are substantially similar to the method described in the apparatus and system embodiments, which are therefore relatively simply described. A part of description of other embodiments may be referred to for relevant details.

It should be understood that particular embodiments of the present specification are described above. Other embodiments are encompassed within the scope of the claims. In some cases, actions or steps disclosed in the claims may be executed in an order different from that in embodiments, and can still achieve desired results. In addition, the processes depicted in the drawings are not necessarily required to achieve the desired results in the shown particular order or in a sequential order. In some embodiments, multitasking and parallel processing may also be feasible, or may be advantageous.

It should be understood that an element described herein in a singular form or only one of the element shown in the drawings does not mean that the number of the element is limited to one. Further, modules or elements described or shown as separate modules or elements herein may be combined into a single module or element, and a module or element described or shown as a single module or element herein may be split into a plurality of modules or elements.

It should be further understood that the terms and expressions used herein are for description only, and one or more embodiments of the present specification should not be limited to these terms and expressions. The use of these terms and expressions does not mean to exclude equivalent features of any illustrations and descriptions (or parts thereof), and it should be appreciated that various possible modifications should also be included within the scope of the claims. There may also be other modifications, alterations, and replacements. Accordingly, the claims should be deemed to cover all these equivalents.

The invention claimed is:

1. A method for signal processing, comprising:
performing PWM modulation on an input signal to obtain a PWM positive signal and a PWM negative signal; and
outputting a positive output signal and a negative output signal based on the PWM positive signal and the PWM negative signal; wherein
in response to an absolute value of an amplitude of the input signal being larger than 0 and smaller than a first threshold, each of the positive output signal and the negative output signal includes 2 pulses within one pulse period, and pulse widths of the pulses included in the positive output signal are different from pulse widths of the pulses included in the negative output signal.

2. The method according to claim 1, wherein
in response to any one input signal with an absolute value of an amplitude falling within a range of (0, first threshold), a pulse width of a pulse included in one output signal of the positive output signal and the negative output signal is equal to a preset second threshold, and a pulse width of a pulse included in the other output signal of the positive output signal and the negative output signal is larger than the second threshold.

3. The method according to claim 2, wherein, when the absolute value of the amplitude of the input signal is larger than 0 and smaller than the first threshold, a falling edge of a pulse included in the positive output signal is temporally aligned to a falling edge of a pulse included in the negative output signal.

4. The method according to claim 2, wherein
in response to the amplitude of the input signal being equal to 0, each of the positive output signal and the negative output signal includes 1 pulse within one pulse period, the pulse widths of the pulses included in the positive output signal and the pulse widths of the pulses included in the negative output signal are each equal to the second threshold, and a differential mode pulse width of the positive output signal and the negative output signal is equal to 0.

5. The method according to claim 2, wherein
in response to the absolute value of the amplitude of the input signal being larger than the first threshold, one output signal of the positive output signal and the negative output signal does not include a pulse, and the other output signal of the positive output signal and the negative output signal includes 2 pulses with pulse widths larger than the second threshold within one pulse period.

6. The method according to claim 2, wherein the performing PWM modulation on the input signal to obtain the PWM positive signal and the PWM negative signal includes:

filtering the input signal to obtain a first positive signal and a first negative signal;
comparing the first positive signal and the first negative signal with a triangular wave signal, and generating a second positive signal and a second negative signal based on a comparison result, wherein a period of the triangular wave is equal to the pulse period, and each of the second positive signal and the second negative signal is a square wave signal; and
generating the PWM positive signal and the PWM negative signal based on the second positive signal, the second negative signal, and the second threshold.

7. The method according to claim 6, wherein, when the amplitude of the input signal is equal to 0, each of the PWM positive signal and the PWM negative signal includes 1 pulse with a pulse width equal to the second threshold, and falling edges of the pulses included in the PWM positive signal and the PWM negative signal are all temporally aligned to falling edges of pulses included in the second positive signal and the second negative signal.

8. The method according to claim 6, wherein, when the absolute value of the amplitude of the input signal is larger than 0 and smaller than the first threshold, each of the PWM positive signal and the PWM negative signal includes 2 pulses, and falling edges of the 2 pulses included in the PWM positive signal are respectively temporally aligned to falling edges of the 2 pulses included in the PWM negative signal;
in response to a pulse included in the second positive signal and a pulse included in the second negative signal being low levels, the PWM positive signal and the PWM negative signal satisfy: in response to the first positive signal being larger than the first negative signal, pulse widths of the 2 pulses included in the PWM positive signal are $T_{diff\ 1}+T_c$ and $T_{diff\ 2}+T_c$ respectively, pulse widths of the 2 pulses included in the PWM negative signal are each $T_c$, a rising edge of the pulse with the pulse width $T_{diff\ 1}+T_c$ included in the PWM positive signal is temporally aligned to a falling edge of the pulse included in the second negative signal, a rising edge of the pulse with the pulse width $T_{diff\ 2}+T_c$ included in the PWM positive signal is temporally aligned to a rising edge of the pulse included in the second positive signal; in response to the first positive signal being smaller than the first negative signal, pulse widths of the 2 pulses included in the PWM negative signal are $T_{diff\ 1}+T_c$ and $T_{diff\ 2}+T_c$ respectively, pulse widths of the 2 pulses included in the PWM positive signal are each $T_c$, a rising edge of the pulse with the pulse width $T_{diff\ 1}+T_c$ included in the PWM negative signal is temporally aligned to a falling edge of the pulse included in the second positive signal, and a rising edge of the pulse with the pulse width $T_{diff\ 2}+T_c$ included in the PWM negative signal is temporally aligned to a rising edge of the pulse included in the second negative signal;
in response to a pulse included in the second positive signal and a pulse included in the second negative signal being high levels, the PWM positive signal and the PWM negative signal satisfy: in response to the first positive signal being larger than the first negative signal, pulse widths of the 2 pulses included in the PWM negative signal are $T_{diff\ 1}+T_c$ and $T_{diff\ 2}+T_c$ respectively, pulse widths of the 2 pulses included in the PWM positive signal are each $T_c$, a rising edge of the pulse with the pulse width $T_{diff\ 1}+T_c$ included in the PWM negative signal is temporally aligned to a rising edge of the pulse included in the second negative signal, a rising edge of the pulse with the pulse width $T_{diff\ 2}+T_c$ included in the PWM negative signal is temporally aligned to a falling edge of the pulse included in the second positive signal; and in response to the first positive signal being smaller than the first negative signal, pulse widths of the 2 pulses included in the PWM positive signal are $T_{diff\ 1}+T_c$ and $T_{diff\ 2}+T_c$ respectively, pulse widths of the 2 pulses included in the PWM negative signal are each $T_c$, a rising edge of the pulse with the pulse width $T_{diff1}+T_c$ included in the PWM positive signal is temporally aligned to a rising edge of the pulse included in the second positive signal, and a rising edge of the pulse with the pulse width $T_{diff\ 2}+T_c$ included in the PWM positive signal is temporally aligned to a falling edge of the pulse included in the second negative signal;

wherein the $T_{diff\ 1}$ and $T_{diff\ 2}$ are used to represent pulse widths of 2 pulses included in a differential mode signal of the second positive signal and the second negative signal, and the $T_c$ is used to represent the second threshold.

9. The method according to claim 6, wherein, when the absolute value of the amplitude of the input signal is larger than the first threshold, in response to a pulse included in the second positive signal and a pulse included in the second negative signal being low levels, the PWM positive signal and the PWM negative signal satisfy: in response to the first positive signal being larger than the first negative signal, the PWM positive signal includes 2 pulses with pulse widths of $T_{diff1}$ and $T_{diff2}$ respectively, the PWM negative signal does not include a pulse, a rising edge of the pulse with the pulse width $T_{diff1}$ included in the PWM positive signal is temporally aligned to a falling edge of the pulse included in the second negative signal, a falling edge of the pulse with the pulse width $T_{diff\ 2}$ included in the PWM positive signal is temporally aligned to a rising edge of the pulse included in the second negative signal; in response to the first positive signal being smaller than the first negative signal, the PWM negative signal includes 2 pulses with pulse widths of $T_{diff\ 1}$ and $T_{diff\ 2}$ respectively, the PWM positive signal does not include a pulse, a rising edge of the pulse with the pulse width $T_{diff\ 1}$ included in the PWM negative signal is temporally aligned to a falling edge of the pulse included in the second positive signal, and a falling edge of the pulse with the pulse width $T_{diff\ 2}$ included in the PWM negative signal is temporally aligned to a rising edge of the pulse included in the second positive signal;

in response to a pulse included in the second positive signal and a pulse included in the second negative signal being high levels, the PWM positive signal and the PWM negative signal satisfy: in response to the first positive signal being larger than the first negative signal, a rising edge of the pulse with the pulse width $T_{diff\ 1}$ included in the PWM negative signal is temporally aligned to a rising edge of the pulse included in the second negative signal, a falling edge of the pulse with the pulse width $T_{diff\ 1}$ included in the PWM negative signal is temporally aligned to a rising edge of the pulse included in the second positive signal, a rising edge of the pulse with the pulse width $T_{diff\ 2}$ included in the PWM negative signal is temporally aligned to a falling edge of the pulse included in the second positive signal, a falling edge of the pulse with the pulse width $T_{diff\ 2}$ included in the PWM negative signal is temporally aligned to a falling edge of the pulse included in the second negative signal; and in response to the first positive signal being smaller than the first negative signal, the PWM positive signal includes 2 pulses with pulse widths of $T_{diff\ 1}$ and $T_{diff\ 2}$ respectively, the PWM negative signal does not include a pulse, a rising edge of the pulse with the pulse width $T_{diff\ 1}$ included in the PWM positive signal is temporally aligned to a rising edge of the pulse included in the second positive signal, a falling edge of the pulse with the pulse width $T_{diff\ 1}$ included in the PWM positive signal is temporally aligned to a rising edge of the pulse included in the second negative signal, a rising edge of the pulse with the pulse width $T_{diff\ 2}$ included in the PWM positive signal is temporally aligned to a falling edge of the pulse included in the second negative signal, and a falling edge of the pulse with the pulse width $T_{diff\ 2}$ included in the PWM positive signal is temporally aligned to a falling edge of the pulse included in the second positive signal;

wherein the $T_{diff\ 1}$ and $T_{diff\ 2}$ are used to represent pulse widths of 2 pulses included in a differential mode signal of the second positive signal and the second negative signal, and the $T_c$ is used to represent the second threshold.

10. The method according to claim 6, wherein the generating the PWM positive signal and the PWM negative signal based on the second positive signal, the second negative signal, and the second threshold includes:

delaying the second positive signal for a preset delay duration, and performing logical NOT operation on the delayed second positive signal to obtain a first delayed inversion signal;

performing logical NOR operation on the first delayed inversion signal and the second negative signal to obtain a third positive signal;

determining, in response to a pulse width of a pulse included in the third positive signal being larger than the second threshold, the third positive signal as a fourth positive signal, and temporally backward increasing, in response to the pulse width of the pulse included in the third positive signal being smaller than the second threshold, the pulse width of the pulse included in the third positive signal by the second threshold to obtain a fourth positive signal;

delaying the second negative signal for the delay duration, and performing logical NOT operation on the delayed second negative signal to obtain a second delayed inversion signal;

performing logical NOR operation on the second delayed inversion signal and the second positive signal to obtain a third negative signal;

determining, in response to a pulse width of a pulse included in the third negative signal being larger than the second threshold, the third negative signal as a fourth negative signal, and temporally backward increasing, in response to the pulse width of the pulse included in the third negative signal being smaller than the second threshold, the pulse width of the pulse included in the third negative signal by the second threshold to obtain a fourth negative signal;

performing logical OR operation on the fourth positive signal and the fourth negative signal to obtain a fifth signal;

performing logical OR operation on the third positive signal and the fifth signal to obtain the PWM positive signal; and performing logical OR operation on the third negative signal and the fifth signal to obtain the PWM negative signal.

11. The method according to claim 6, wherein the generating the PWM positive signal and the PWM negative signal based on the second positive signal, the second negative signal, and the second threshold includes:

performing differential mode pulse width extraction on the second positive signal and the second negative signal, to obtain a first positive differential mode signal and a first negative differential mode signal;

performing differential mode pulse width detection on the first positive differential mode signal and the first negative differential mode signal, to obtain a second positive differential mode signal and a second negative differential mode signal;

performing common mode pulse width generation based on the second positive differential mode signal and the second negative differential mode signal to obtain a positive common mode signal and a negative common mode signal; and performing PWM signal generation based on the first positive differential mode signal, the first negative differential mode signal, the positive common mode signal, the negative common mode signal, and the second threshold, to obtain the PWM positive signal and the PWM negative signal.

12. The method according to claim 2, wherein a value range of the second threshold is [T/40, T/10], wherein T is used to represent a duration of the pulse period.

13. The method according to claim 6, wherein the outputting the positive output signal and the negative output signal based on the PWM positive signal and the PWM negative signal includes:

amplifying an amplitude of the PWM positive signal to obtain the negative output signal, and amplifying an amplitude of the PWM negative signal to obtain the positive output signal; or amplifying the amplitude of the PWM positive signal to obtain the positive output signal, and amplifying the amplitude of the PWM negative signal to obtain the negative output signal.

14. The method according to claim 1, wherein the input signal is an audio signal, the positive output signal and the negative output signal are used to drive a speaker, and the speaker is configured to play the audio signal after signal processing.

15. A circuit for signal processing, comprising:

a modulation module configured to perform PWM modulation on an input signal to obtain a PWM positive signal and a PWM negative signal; and a power output module configured to output a positive output signal and a negative output signal based on the PWM positive signal and the PWM negative signal; wherein in response to an absolute value of an amplitude of the input signal being larger than 0 and smaller than a first threshold, each of the positive output signal and the negative output signal includes 2 pulses within one pulse period, and pulse widths of the pulses included in the positive output signal are different from pulse widths of the pulses included in the negative output signal.

16. The circuit according to claim 15, wherein, in response to any one input signal with an absolute value of an amplitude falling within a range of (0, first threshold), a pulse width of a pulse included in one output signal of the positive output signal and the negative output signal is equal to a preset second threshold, and a pulse width of a pulse included in the other output signal of the positive output signal and the negative output signal is larger than the second threshold.

17. The circuit according to claim 16, wherein the modulation module includes: a loop filter unit, a comparison unit, and a logical operation unit; wherein the loop filter unit is configured to filter the input signal to obtain a first positive signal and a first negative signal;

the comparison unit is configured to compare the first positive signal and the first negative signal with a triangular wave signal, and generate a second positive signal and a second negative signal based on a comparison result, wherein a period of the triangular wave is equal to the pulse period, and each of the second positive signal and the second negative signal is a square wave signal; and the logical operation unit is configured to generate the PWM positive signal and the PWM negative signal based on the second positive signal, the second negative signal, and the second threshold.

18. The circuit according to claim 17, wherein the logical operation unit includes: a differential signal extraction subunit, a differential mode pulse width detection subunit, a pulse width adjustment subunit, and a signal processing subunit; wherein the differential signal extraction subunit is configured to perform logical NOT operation on the second positive signal and then delay for a preset delay duration to obtain a first delayed inversion signal, perform logical NOR operation on the first delayed inversion signal and the second negative signal to obtain a third positive signal, perform logical NOT operation on the second negative signal and then delay for the preset delay duration to obtain a second delayed inversion signal, and perform logical NOR operation on the second delayed inversion signal and the second positive signal to obtain a third negative signal;

the differential mode pulse width detection subunit is configured to detect a pulse width of a pulse included in the third positive signal and a pulse width of a pulse included in the third negative signal;

the pulse width adjustment subunit is configured to determine, when the pulse width of the pulse included in the third positive signal being larger than the second threshold, the third positive signal as a fourth positive signal, temporally backward increase, when the pulse width of the pulse included in the third positive signal being smaller than the second threshold, the pulse width of the pulse included in the third positive signal by the second threshold to obtain a fourth positive signal, determine, when the pulse width of the pulse included in the third negative signal being larger than the second threshold, the third negative signal as a fourth negative signal, and temporally backward increase, when the pulse width of the pulse included in the third negative signal being smaller than the second threshold, the pulse width of the pulse included in the third negative signal by the second threshold to obtain a fourth negative signal; and the signal processing subunit is configured to perform logical OR operation on the fourth positive signal and the fourth negative signal to obtain a fifth signal, perform logical OR operation on the third positive signal and the fifth signal to obtain the PWM positive signal, and perform logical OR operation on the third negative signal and the fifth signal to obtain the PWM negative signal.

19. The circuit according to claim 17, wherein the logical operation unit is configured to:

perform differential mode pulse width extraction on the second positive signal and the second negative signal to obtain a first positive differential mode signal and a first negative differential mode signal;

perform differential mode pulse width detection on the first positive differential mode signal and the first negative differential mode signal, to obtain a second positive differential mode signal and a second negative differential mode signal;

perform common mode pulse width generation based on the second positive differential mode signal and the second negative differential mode signal, to obtain a positive common mode signal and a negative common mode signal; and perform PWM signal generation based on the first positive differential mode signal, the first negative differential mode signal, the positive common mode signal, the negative common mode signal, and the second threshold, to obtain the PWM positive signal and the PWM negative signal.

20. A chip for signal processing, wherein the chip for signal processing is configured to implement the method according to claim 1.

* * * * *